US006235842B1

(12) United States Patent
Kuwano et al.

(10) Patent No.: US 6,235,842 B1
(45) Date of Patent: May 22, 2001

(54) PHASE-SEPARATED CARBOXYL GROUP-CONTAINING ELASTOMER MODIFIED PHOENOXY RESIN OPTIONALLY WITH EPOXY RESIN

(75) Inventors: Atsushi Kuwano, Tsukuba; Shinsuke Hagiwara, Shimodate, both of (JP)

(73) Assignee: Hitachi Chemical Company, Ltd. (JP)

( * ) Notice: Subject to any disclaimer, the term of this patent is extended or adjusted under 35 U.S.C. 154(b) by 0 days.

(21) Appl. No.: 09/284,127

(22) PCT Filed: Oct. 8, 1997

(86) PCT No.: PCT/JP97/03617

§ 371 Date: Jun. 7, 1999

§ 102(e) Date: Jun. 7, 1999

(87) PCT Pub. No.: WO98/15597

PCT Pub. Date: Apr. 16, 1998

(30) Foreign Application Priority Data

Oct. 8, 1996 (JP) ..................................... 8-267140

(51) Int. Cl.[7] .............................. C08K 3/36; C08L 63/02; B32B 27/04; H01L 23/29
(52) U.S. Cl. .................... 525/119; 525/109; 525/113; 525/114; 428/413; 428/418; 438/127; 523/428; 523/434
(58) Field of Search ..................................... 525/119, 109, 525/113, 114; 523/428, 434; 428/413, 418; 438/127

(56) References Cited

U.S. PATENT DOCUMENTS 4,855,001 * 8/1989 Damico et al. ...................... 525/111

FOREIGN PATENT DOCUMENTS

| 60-248769 | 12/1985 | (JP) . |
| 61-228059 | 10/1986 | (JP) . |
| 61-228060 | 10/1986 | (JP) . |
| 61-287952 | 12/1986 | (JP) . |
| 62-252472 | 11/1987 | (JP) . |
| 2-147618 | 6/1990 | (JP) . |
| 4-266957 | 9/1992 | (JP) . |
| 63-69872 | 3/1998 | (JP) . |

OTHER PUBLICATIONS

M. Shimbo et al., "Modification Of Epoxide Resins With Liquid Polybutadiene Derivatives", Japan Adhesion Society, vol. 16, No. 7, pp. 271–277 (1980).
M. Shimbo et al., "Modification Of Epoxide Resin With Butadiene–acrylonitrile Copolymer Derivatives", Japan Adhesion Society, vol. 17, No. 5, pp. 192–200 (1981).
M. Shimbo et al., "Internal Stress Of Epoxide Resin Modified With Polybutadiene Derivatives", Japan Adhesion Society, vol. 17, No. 12, pp. 507–513 (1981).
L.T. Manzione et al., "Rubber–modified Epoxies. II. Morphology And Mechanical Properties", Journal Applied Polymer Science, vol. 26, pp. 907–919 (1981).

* cited by examiner

Primary Examiner—Robert E. L. Sellers
(74) Attorney, Agent, or Firm—Pennie & Edmonds LLP

(57) ABSTRACT

The present invention provides a phase-separation structure comprising a phenoxy resin modified with a carboxylated elastomer, prepared from a phenoxy resin and a carboxylated elastomer, the resin and the elastomer constituting a phase-separation structure, wherein the light transmittance of the structure in a 75 μm-thick film form at a wavelength of 500 nm is not less than 10% of the light transmittance of the air, which is useful as adhesives, film materials, and molding materials for encapsulating electronic components.

24 Claims, 1 Drawing Sheet

PHASE-SEPARATED CARBOXYL GROUP-CONTAINING ELASTOMER MODIFIED PHOENOXY RESIN OPTIONALLY WITH EPOXY RESIN

TECHNICAL FIELD

This invention relates to a phase-separated structure used in adhesives, electronic materials, coating materials, film materials and so forth, a resin composition and a molding material for encapsulating which comprise the structure, and an electronic component device having electronic components encapsulated with the molding material.

BACKGROUND ART

Phenoxy resin is one of thermoplastic aromatic polyether resins having a high molecular weight (commonly 20,000 or more), which is grouped as an independent unique resin different from thermosetting epoxy resins having a low molecular weight (commonly 5,000 or less) and has features such that the resin can form films by itself and has a flexibility. This phenoxy resin has so superior adhesion, flexibility and impact resistance that it can be used as an adhesive and a coating material without any assistant action of a curing agent or catalyst ("Plastic Handbook", pages 499–501, published in 1986 by Asakura Shoten).

Meanwhile, as electronic equipment such as liquid-crystal television sets, word processors, personal computers, IC (integrated circuit) cards and electronic pocketbooks are made compact and thin-gage, there is an increasing demand for making IC packages more compact and thin-gage. To meet such a demand, IC chips are encapsulated with a liquid encapsulating material in the field of bare chip packaging such as TCP (tape carrier package), COB (chip on board), COG (chip on glass) and MCM (multi-chip module). TCP making use of such a liquid encapsulating material has already been prevailing in ICs for driving LCD panels. In future, this TCP is expected to create a rapid increase in demand with progress of LCD's and other related products. TCP making use of a film tape in the substrate is greatly characteristic of enabling bend packaging. In such packaging, the encapsulating material undergoes a tension when the tape is bent, and hence the encapsulating material is required to have a flexibility, a toughness and a high adhesion to the film tape.

In encapsulating materials, epoxy resins are widely used, which have overall superior electrical characteristics, heat resistance and adhesion. Cured products thereof, however, commonly have disadvantages that they have a high modulus of elasticity and are hard and brittle, and may cause a decrease in adhesion such as peel strength. For this reason, it has been attempted from old times that epoxy resins are modified by, e.g., blending or pre-reacting them with reactive elastomers to impart flexibility and toughness and also to relax internal stress.

For example, Japan Adhesion Society, Vol. 16, No. 7, pages 271–277 (1980) and Japan Adhesion Society, Vol. 17, No. 5, pages 192–200 (1981) report that a heat-cured product of a blend comprised of a bisphenol epoxy resin (molecular weight: 380; EPIKOTE 828), a polybutadiene having a terminal carboxyl group and a butadiene-acrylonitrile copolymer can be improved in elongation, impact strength and peel strength. Japan Adhesion Society, Vol. 17, No. 12, pages 507–513 (1981) reports that a heat-cured product of a blend comprised of a bisphenol epoxy resin (molecular weight: 380, EPIKOTE 828) and a polybutadiene having a terminal carboxyl group can have a low internal stress. Japanese Patent Publication No. 63-60067 also discloses a liquid IC-encapsulating resin composition comprising a liquid epoxy resin (molecular weight: 380; EPIKOTE 828) blended similarly with from 10 to 40 PHR of a butadiene-acrylonitrile copolymer having a terminal carboxyl group.

As methods for modifying epoxy resins with the polybutadiene elastomer having a terminal carboxyl group, not only the above simple blending but also a method is available in which the epoxy resin is beforehand allowed to pre-react with the polybutadiene elastomer having a terminal carboxyl group. This pre-reaction is reported in detail in The 30th Heat-curable Resin Symposium, pages 13–16 (1980), The 31st Heat-curable Resin Symposium, pages 69–72 (1980), J. Appl. Polym. Sci., Vol. 26, pages 907–919 (1981) and The 22nd Adhesion Research Report Meeting, pages 78–79 (1984). Thus, what has been attempted is chiefly the modification of epoxy resins having a small value of epoxy equivalent weight ["SECCHAKU (Adhesion)", Vol.32, No. 11, pages 16–18 (1988)]. In particular, The 22nd Adhesion Research Report Meeting, pages 78–79 (1984) reports that a cured product of an epoxy resin (EPIKOTE 828; molecular weight: 380; epoxy equivalent weight: 184 to 194) pre-reacted with a butadiene-acrylonitrile copolymer having a terminal carboxyl group can be improved in peel strength and tensile shear strength. Japanese Patent Application Laid-open No. 61-287952 also discloses an IC-encapsulating resin composition comprising a liquid epoxy resin modified (pre-reacted) with a similar butadiene-acrylonitrile copolymer having a terminal carboxyl group, serving as a stress relaxation agent.

As another method for making the cured product have a low internal stress, a method is available which utilizes the relaxation of linear polymers. Japan Adhesion Society, Vol. 22, No. 5, pages 255–261 (1986) reports that the cured product has a low internal stress when a phenoxy resin used as a linear polymer is added to the bisphenol epoxy resin (molecular weight: 380; EPIKOTE 828). Japanese Patent Application Laid-open No. 61-228060 discloses an epoxy resin composition comprised of i) an epoxy resin pre-reacted with a butadiene-acrylonitrile copolymer having a carboxyl group, ii) a phenoxy resin and iii) a curing agent. Japanese Patent Publication No. 7-30284 discloses a cold-drying, baking coating composition comprised of a hydroxyl-group-containing high-molecular-weight resin and a blocked isocyanate. Japanese Patent Application Laid-open No. 2-147618 discloses a resin composition in which a fine powder of a blocked isocyanate and/or dicyandiamide is used as a curing agent for curing liquid epoxy resins and phenoxy resins.

Phenoxy resins can be used as adhesives and coating materials without any assistant action of a curing agent or a catalyst. Conventional phenoxy resins, however, can not ensure by themselves a sufficient adhesion strength (peel strength) to adherends, depending on purposes. Thus, they are sought to be more improved in adhesion strength (peel strength).

Meanwhile, the epoxy resin modified by blending or pre-reacting it with a butadiene-acrylonitrile copolymer having a terminal carboxyl group, disclosed in Japanese Patent Publication No. 63-60067 and Japanese Patent Application Laid-open No. 61-287952, can not attain by itself a sufficient adhesion strength (peel strength) especially to polyimide tapes which are base materials for TCP. Similarly, the epoxy resin modified with a butadiene-acrylonitrile copolymer having a carboxyl group and the phenoxy resin, disclosed in Japanese Patent Application Laid-open No. 61-228060, can not attain by themselves a sufficient adhesion strength (peel strength) to the polyimide tapes.

The composition disclosed in Japanese Patent Publication No. 7-30284 contains no epoxy resin, and hence can not attain a sufficient adhesion strength (peel strength) to the polyimide tapes. Also, when an isocyanate is used in which a compound serving as a curing agent of epoxy resin and being non-volatile is used as a blocking agent, any unreacted blocking agent may remain in the cured product after dissociation of the block isocyanate, because no epoxy resin is contained. This may adversely affect the properties of cured products, such as water resistance, mechanical properties and adhesion, as so predicted. As for the resin composition disclosed in Japanese Patent Application Laid-open No. 2-147618, similarly it can not attain a sufficient adhesion strength (peel strength) to the polyimide tapes. Also, the epoxy resin and the phenoxy resin are blended by heating and melting them after the phenoxy resin is brought into a powdery state, where the resultant composition has a very high viscosity of from 2,000 to 20,000 poises at 50° C. Hence, in a case where an inorganic filler is added, the composition may have so higher a viscosity that it is very difficult to use it in liquid encapsulating material. It is difficult to use such baking coating composition or sealing adhesives as they are, in the field of semiconductors as in TCP liquid encapsulating material. Thus, from a stand point of research and from a technical viewpoint, it is a great subject in various resin compositions to design materials that can satisfy the properties of molding materials for encapsulating electronic components.

DISCLOSURE OF THE INVENTION

As a result of extensive studies made in order to solve the problems discussed above, the present inventors have discovered that the adhesion attributable to resin by itself can be improved by preparing a composition having a phase-separated structure (hereinafter "phenoxy resin modified with a carboxyl-group-containing elastomer") which is obtained from a carboxyl-group-containing elastomer and a phenoxy resin and being visibly optically transparent or semitransparent and being able to be made into a film.

As a result of extensive studies also made in order to solve the problems on the properties of resins, required as liquid encapsulating material for TCP in the field of semiconductors, they have discovered that cured products can be endowed with a low elasticity and a toughness and also can have a superior adhesion to adherends, in particular, to film tapes of TCP when the phenoxy resin modified with a carboxyl-group-containing elastomer is used in combination with an epoxy resin. Thus, they have accomplished the present invention.

The present invention provides a phase-separated structure being obtained from a phenoxy resin and a carboxyl-group-containing elastomer;

the phenoxy resin and the carboxyl-group-containing elastomer standing phase-separated in the structure; and the phase-separated structure having a light transmittance of 10% or more of the light transmittance of air at a wavelength of 500 nm, as a film form of 75 µm in layer thickness.

Here, the phenoxy resin may preferably have as a component unit an atomic group represented by the following general formula (I), and may further contain as a component unit an atomic group represented by the following general formula (II). With regard to the component unit (I), at least one unit may preferably be contained in one molecule, and the number of the component unit (I) to the number of the whole component units in one molecule may preferably be in a proportion of 10% or more, and particularly preferably from 20% to 80%.

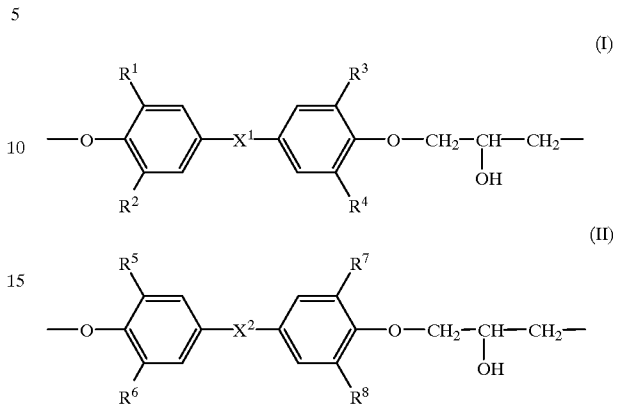

Here, $X^1$ and $X^2$ each represent a divalent organic group or a bond. $X^1$ and $X^2$ may be the same or different. $R^1$, $R^2$, $R^3$ and $R^4$ are each independently selected from a hydrogen atom, an alkyl group having 1 to 4 carbon atoms and an electron-withdrawing group, and at least one of them is an electron-withdrawing group. $R^1$, $R^2$, $R^3$ and $R^4$ may be the same or different. $R^5$, $R^6$, $R^7$ and $R^8$ are each independently selected from a hydrogen atom and an alkyl group having 1 to 4 carbon atoms, and may be the same or different.

The present invention also provides a resin composition comprising the above phase-separated structure, an epoxy resin and a curing agent for the epoxy resin, and a molding material for encapsulating electronic components which comprises such a resin composition.

The present invention still also provides a molding material for encapsulating electronic components which comprises (A) an epoxy resin, (B) a phenoxy resin modified with a carboxyl-group-containing elastomer, (C) a curing agent for the epoxy resin, (D) a curing agent for the phenoxy resin, (E) an inorganic filler and (F) an organic solvent.

In this molding material for encapsulating electronic components, the component-(B) elastomer-modified phenoxy resin may preferably be a phenoxy resin modified with a carboxyl-group-containing elastomer, which is obtained by at least blending, from 50 to 85% by volume of a phenoxy resin and from 10 to 35% by volume of an elastomer, and the component-(A) epoxy resin may preferably be in a content of from 2 to 25% by volume, regarding as 100% by volume the total weight of the component-(A) epoxy resin and component-(B) elastomer-modified phenoxy resin the molding material contains.

The present invention further provides an electronic component device having an electronic component encapsulated with the molding material for encapsulating electronic components.

The phenoxy resin used as a raw material when the phenoxy resin modified with a carboxyl-group-containing elastomer is prepared, which is the component (B) in the phase-separated structure, resin composition or molding material, is a resin obtained by allowing a bifunctional phenol to react with an epihalohydrin until the reaction product has a high molecular weight or subjecting a bifunctional epoxy resin and a bifunctional phenol to polyaddition reaction. Stated specifically, it can be obtained by allowing 1 mol of a bifunctional phenol to react with 0.985 mol to 1.015 mols of an epihalohydrin in the presence of an alkali metal hydroxide, in a non-reactive solvent and at a temperature of from 40 to 120° C.

In view of mechanical properties and thermal properties of the resin, what is particularly preferred is a resin obtained by subjecting a bifunctional epoxy resin and a bifunctional phenol, which are mixed in an equivalent weight ratio of epoxy group/phenolic hydroxyl group=1/0.9 to 1/1.1, to polyaddition reaction in the presence of a catalyst such as an alkali metal compound, an organic phosphorus compound or a cyclic amine compound, in an amide type, ether type, ketone type, lactone type or alcohol type organic solvent having a boiling point of 120° C. or above, at a reaction solid-matter concentration of 50% by weight or less and with heating at 50 to 200° C.

The bifunctional epoxy resin may include bisphenol A epoxy resins, bisphenol F epoxy resins, bisphenol AD epoxy resins, bisphenol S epoxy resins, and alkylene oxide addition products, halides (e.g., a tetrabromobisphenol epoxy resin) or hydrogenated products of these, as well as alicyclic epoxy resins, aliphatic chain epoxy resins and halides or hydrogenated products of these.

These compounds may have any molecular weight, and those having a purity as high as possible are preferred especially when reacted with the bifunctional phenol. Some of these compounds may be used in combination. The epihalohydrin may include epichlorohydrin, epibromohydrin and epiiodohydrin.

The bifunctional phenol may be any of phenols so long as they are compounds having two phenolic hydroxyl groups, as exemplified by monocyclic bifunctional phenols such as hydroquinone, 2-bromohydroquinone, resorcinol and catechol; bisphenols such as bisphenol A, bisphenol F, bisphenol AD and bisphenol S; dihydroxybiphenyls such as 4,4'-dihydroxybiphenyl; dihydroxyphenyl ethers such as bis(4-hydroxyphenyl) ether; any of these into the aromatic ring of the phenolic skeleton of which a straight-chain alkyl group, a branched alkyl group, an aryl group, a methylol group, an allyl group, a cyclic aliphatic group, a halogen (e.g., tetrabromobisphenol A) or a nitro group has been introduced; and polycyclic bifunctional phenols comprising any of these into the carbon atom present at the center of the bisphenolic skeleton of which a straight-chain alkyl group, a branched alkyl group, an allyl group, a substituted allyl group, a cyclic aliphatic group or an alkoxycarbonyl group has been introduced.

Stated specifically, it may include 4,4'-(1-methylethylidene)bis[2-methylphenol], 4,4'-methylenebis[2-methylphenol], 4,4'-(1-methylethylidene)bis[2-(1-methylethyl)phenol], 4,4'-(1-methylethylidene)bis[2-(1,1-methylpropyl)phenol], 4,4'-(1-methylethylidene)bis[2-(1,1-dimethylethyl)phenol], tetramethylbisphenol A, tetramethylbisphenol F, 4,4'-methylenebis[2,6-bis(1,1-dimethylethyl)phenol], 4,4'-(1-methylethylidene)bis[2,6-di(1,1-dimethylethyl)phenol], 4,4'-(1-methylethylidene)bis[2-(2-propenyl)phenol], 4,4'-methylenebis[2-(2-propenyl)phenol], 4,4'-(1-methylethylidene)bis[2-(1-phenylethyl)phenol], 3,3'-dimethyl-[1,1'-biphenyl]-4,4'-diol, 3,3',5,5'-tetramethyl-[1,1'-biphenyl]-4,4'-diol, 3,3', 5,5'-tetra-t-butyl-[1,1'-biphenyl]-4,4'-diol, 3,3'-bis(2-propenyl)-[1,1'-biphenyl]-4,4'-diol, 4,4'-(1-methylethylidene)bis[2-methyl-6-hydroxymethylphenol], tetramethylolbisphenol A, 3,3',5, 5'-tetrakis(hydroxymethyl)-(1,1'-biphenyl)-4,4'-diol, 4,4'-(1-methylethylidene)bis[2-phenylphenol], 4,4'-(1-methylethylidene)bis[2-cyclohexylphenol], 4,4'-methylenebis(2-cyclohexyl-5-methylphenol), 4,4'-(1-methylpropylidene)bisphenol, 4,4'-(1-methylheptylidene)bisphenol, 4,4'-(1-methyloctylidene)bisphenol, 4,4'-(1,3-dimethylbutylidene)bisphenol, 4,4'-(2-ethylhexylidene)bisphenol, 4,4'-(2-methylpropylidene)bisphenol, 4,4'-propylidenebisphenol, 4,4'-(1-ethylpropylidene)bisphenol, 4,4'-(3-methylbutylidene)bisphenol, 4,4'-(1-phenylethylidene)bisphenol, 4,4'-(phenylmethylene)bisphenol, 4,4'-(diphenylmethylene)bisphenol, 4,4'-[1-(4-nitrophenyl)ethylidene]bisphenol, 4,4'-[1-(4-aminophenyl)ethylidene]bisphenol, 4,4'-(4-bromophenyl)methylenebisphenol, 4,4'-(4-chlorophenyl)methylenebisphenol, 4,4'-(4-fluorophenyl)methylenebisphenol, 4,4'-(2-methylpropylidene)bis[3-methyl-6-(1,1-dimethylethyl)phenol], 4,4'-(1-ethylpropylidene)bis[2-methylphenol], 4,4'-(1-phenylethylidene)bis[2-methylphenol], 4,4'-(phenylmethylene)bis-2,3,5-trimethylphenol, 4,4'-(1-phenylethylidene)bis[2-(1,1-dimethylethyl)phenol], 4,4'-(1-methylpropylidene)bis[2-cyclohexyl-5-methylphenol], 4,4'-(1-phenylethylidene)bis[2-phenylphenol], 4,4'-butylidenebis[3-methyl-6-(1,1-dimethylethyl)phenol], 4-hydroxy-α-(4-hydroxyphenyl-α-methylbenzeneacetic acid methyl ester, 4-hydroxy-α-(4-hydroxyphenyl-α-methylbenzeneacetic acid ethyl ester, 4-hydroxy-α-(4-hydroxyphenyl)benzeneacetic acid butyl ester, tetrabromobisphenol A, tetrabromobisphenol F, tetrabromobisphenol AD, 4,4'-(1-methylethylene)bis[2,6-dichlorophenol], 4,4'-(1-methylethylidene)bis[2-chlorophenol], 4,4'-(1-methylethylidene)bis[2-chloro-6-methylphenol], 4,4'-methylenebis[2-fluorophenol], 4,4'-methylenebis[2,6-difluorophenol], 4,4'-isopropylidenebis[2-fluorophenol], 3,3'-difluoro-[1,1'-diphenyl]-4,4'-diol, 3,3',5,5'-tetrafluoro-[1,1'-biphenyl]-4,4'-diol, 4,4'-(phenylmethylene)bis[2-fluorophenol], 4,4'-[(4-fluorophenyl)methylenebis[2-fluorophenol], 4,4'-(phenylmethylene)bis[2,6-difluorophenol], 4,4'-(4-fluorophenyl)methylenebis[2,6-difluorophenol], 4,4'-(diphenylmethylene)bis[2-fluorophenol], 4,4'-(diphenylmethylene)bis[2,6-difluorophenol], and 4,4'-(1-methylethylene)bis[2-nitrophenol].

Polycyclic bifunctional phenols other than these may include 1,4-naphthalenediol, 1,5-naphthalenediol, 1,6-naphthalenediol, 1,7-naphthalenediol, 2,7-naphthalenediol, 4,4'-dihydroxydiphenyl ether, bis(4-hydroxyphenyl) methanone, 4,4'-cyclohexylidenebisphenol, 4,4'-cyclohexylidenebis[2-methylphenol], 4,4'-cyclopentylidenebisphenol, 4,4'-cyclopentylidenebis[2-methylphenol], 4,4'-cyclohexylidene[2,6-dimethylphenol], 4,4'-cyclohexylidenebis[2-(1,1-dimethylethyl)phenol], 4,4'-cyclohexylidenebis[2-cyclohexylphenol], 4,4'-(1,2-ethanediyl)bisphenol, 4,4'-cyclohexylidenebis[2-phenylphenol], 4,4'-[1,4-phenylenebis(1-methylethylidene)]bis[2-methylphenol], 4,4'-[1,3-phenylenebis(1-methylethylidene)]bisphenol, 4,4'-[1,4-phenylenebis(1-methylethylidene)]bisphenol, 4,4'-[1,4-phenylenebis(1-methylethylidene)]bis[2-methyl-6-hydroxymethylphenol], 4-[1-[4-(4-hydroxy-3-methylphenyl)-4-methylcyclohexyl]-1-methylethyl]-2-methylphenol, 4-[1-[4-(4-hydroxy-3,5-dimethylphenyl)-4-methylcyclohexyl]-1-methylethyl]-2,6-dimethylphenol, 4,4'-(1,2-ethanediyl)bis[2,6-di(1,1-dimethylethyl)phenol], 4,4'-(dimethylsilylene)bisphenol, 1,3-bis(p-hydroxyphenyl)-1,1,3,3,-tetramethyldisiloxane, silicone oligomers having p-hydroxyphenyl groups at the both terminals, and 2,2'-methylidenebisphenol, 2,2'-methylethylidenebisphenol or 2,2'-ethylidenebisphenol into the aromatic ring of the phenolic skeleton of which a straight-chain alkyl group, a branched alkyl group, an aryl group, a methylol group or an allyl group has been introduced.

Stated specifically, they include 2,2'-methylidenebis[4-methylphenol], 2,2'-ethylidenebis[4-methylphenol], 2,2'-methylidenebis[4,6-dimethylphenol], 2,2'-(1-methylethylidene)bis[4,6-dimethylphenol], 2,2'-(1-methylethylidene)bis[4-sec-butylphenol], 2,2'-methylidenebis[6-(1,1-dimethylethyl)-4-methylphenol], 2,2'-ethylidenebis[4,6-di(1,1-dimethylethyl)phenol], 2,2'-methylidenebis[4-nonylphenol], 2,2'-methylidenebis[3-methyl-4,6-di-(1,1-dimethylethyl)phenol], 2,2'-(2-methylpropylidene)bis[2,4-dimethylphenol], 2,2'-ethylidenebis[4-(1,1-dimethylethyl)phenol], 2,2'-methylidenebis(2,4-di-t-butyl-5-methylphenol), 2,2'-methylidenebis(4-phenylphenol), 2,2'-methylidenebis[4-methyl-6-hydroxymethylphenol], and 2,2'-methylidenebis[6-(2-propenyl)phenol]. Some of these compounds may be used in combination.

The solution formed after the reaction is completed may be purified by reprecipiation using a bad solvent such as methanol to obtain the product as a solid phenoxy resin. The phenoxy resin thus produced may be used in combination of two or more.

To achieve the objects of the present invention, the resin may preferably be a resin comprised of a first component unit represented by the following general formula (I) and/or a second component unit represented by the following general formula (II) and containing at least one first component unit in the molecule. When a copolymer having both the first component unit and the second component unit is used as the phenoxy resin described above, the first component unit may preferably be contained in the phenoxy resin in an amount of 10 mol % or more, and may more preferably be copolymerized in the ratio of (number of first component unit):(number of second component unit)=2:8 to 8:2. When two or more kinds of phenoxy resins are used, at least one of them may preferably be this resin comprised of the first component unit and the second component unit and containing at least one first component unit in the molecule.

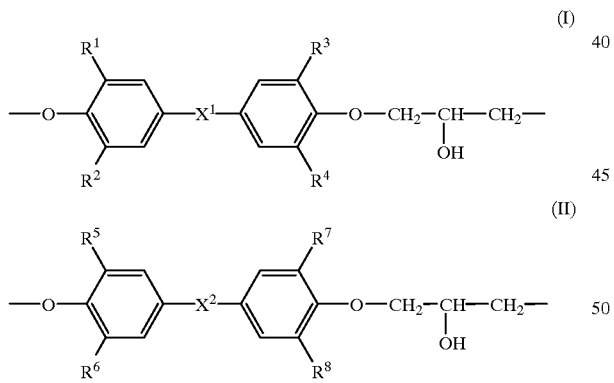

Here, $R^1$, $R^2$, $R^3$ and $R^4$ are each independently selected from a hydrogen atom, an alkyl group having 1 to 4 carbon atoms (such as a methyl group, an ethyl group, a propyl group, a butyl group, an isopropyl group or an isobutyl group) and an electron-withdrawing group, and at least one of them is an electron-withdrawing group. The electron-withdrawing group refers to a group having a plus (+) value as Hammett's substituent constant σ ("KAGAKU JITEN (Chemical Dictionary)", pages 833–834, 1986, published by Morikita Shuppan K.K.), and may include, e.g., halogen atoms such as a fluorine atom, a chlorine atom and a bromine atom, a trifluoromethyl group, a trichloromethyl group, a tribromomethyl group, a nitro group, a nitrile group, alkoxyl groups such as a methoxyl group and an ethoxyl group, a carboxyl group, alkylcarbonyl groups such as a methylcarbonyl group and an ethylcarbonyl group, alkoxycarbonyl group such as a methoxycarbonyl group and an ethoxycarbonyl group, and alkylsulfonyl groups. Halogens are preferred.

$R^5$, $R^6$, $R^7$ and $R^8$ are each independently selected from a hydrogen atom and an alkyl group having 1 to 4 carbon atoms (such as a methyl group, an ethyl group, a propyl group, a butyl group, an isopropyl group or an isobutyl group).

$X^1$ and $X^2$ each represent a divalent organic group or a bond. There are no particular limitations on the divalent organic group represented by $X^1$ and $X^2$, which may include, e.g., the following.

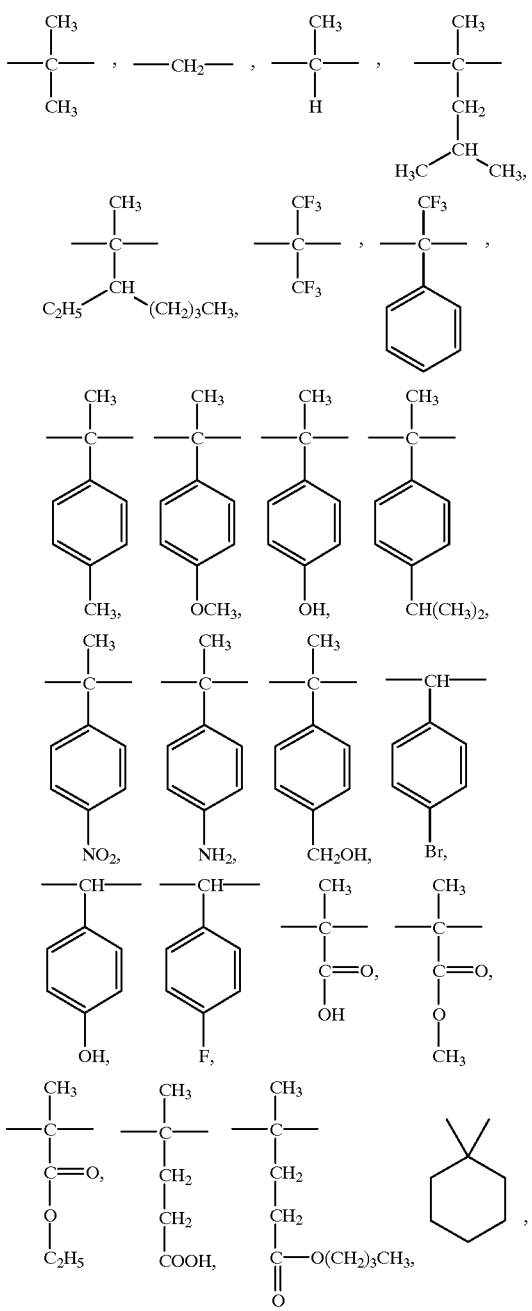

-continued

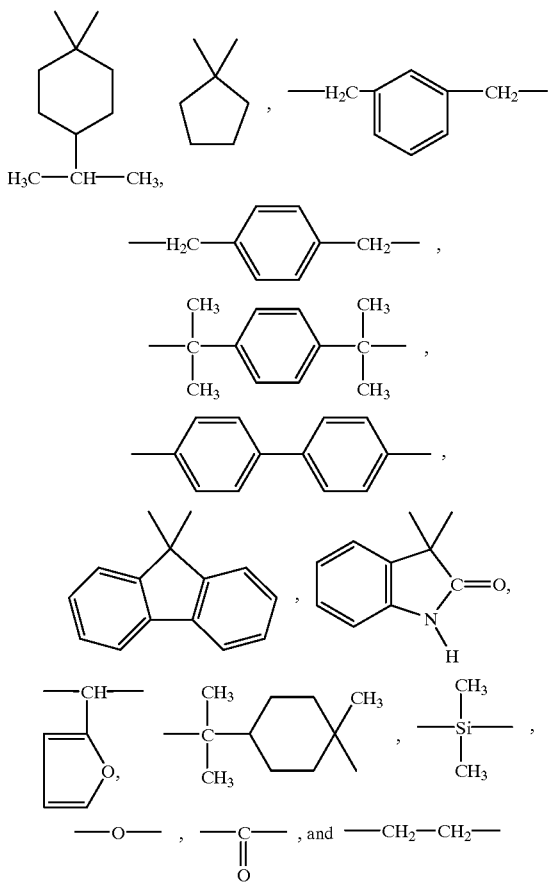

The phenoxy resin as described above can be obtained using synthesis materials at least one of which is the bifunctional epoxy resin and/or bifunctional phenol which have or has these hydrogen atom, alkyl group having 1 to 4 carbon atoms and electron-withdrawing group.

As specific examples of this phenoxy resin, it may include, e.g., random copolymers consist essentially of a repeating unit represented by the following structural formula (III) and a repeating unit represented by the following structural formula (IV):

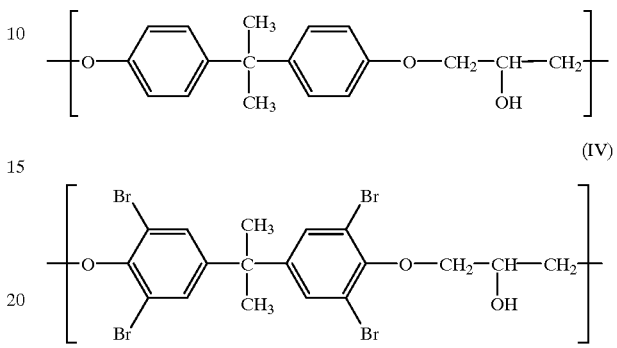

polymers consist essentially or a repeating unit represented by the following structural formula (V):

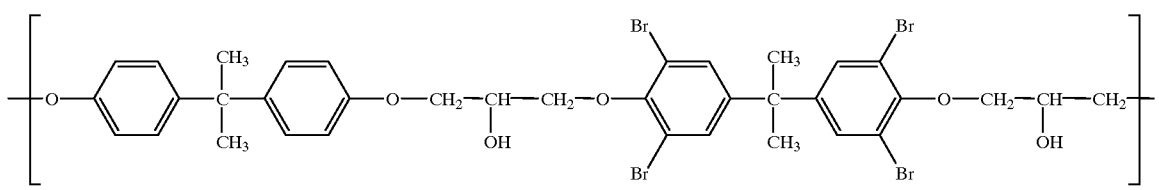

polymers consist essentially of a repeating unit represented by the following structural formula (VI):

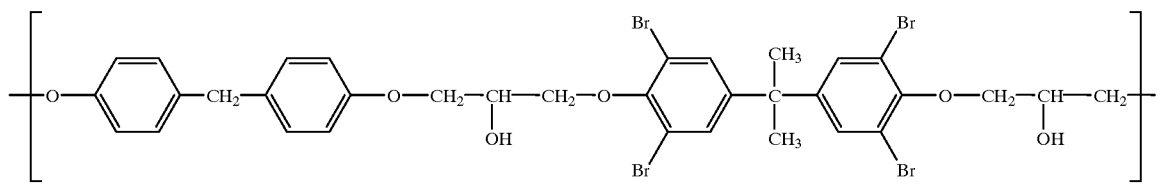

and polymers consist essentially of a repeating unit represented by the following structural formula (VII):

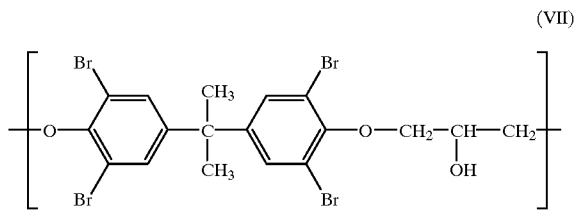

In order for the cured product to exhibit excellent properties in respect of flexibility, toughness, film-forming properties and so forth, a phenoxy resin having a average molecular weight (average molecular weight in terms of polystyrene as measured by gel permeation chromatography) of preferably not less than 10,000, more preferably not less than 20,000, and still more preferably not less than 30,000, may be used. As commercially available products, it may include, e.g., PKHH and PAHJ (available from Union Carbide Corp.); and YPB-43C, YPB-43D, YPB-43G, YPB-43M, YP50, or YPB40ASB25 and YPB-40AM40 (available from Tohto Kasei Co., Ltd.), which may be purified by reprecipitation.

The carboxyl-group-containing elastomer may be any of elastomers so long as they are elastomers having a carboxyl group at the molecular terminal or in the molecular chain, as exemplified by butadiene polymers, acrylic polymers, polyether urethane rubbers, polyester urethane rubbers, polyamide urethane rubbers and silicone rubbers. Butadiene polymers are preferred. The butadiene polymers may include polybutadiene, a butadiene-styrene copolymer and a butadiene-acrylonitrile copolymer. Of these, the butadiene-acrylonitrile copolymer is particularly preferred.

The carboxyl-group-containing elastomer may preferably have a weight-average molecular weight of from 500 to 50,000, more preferably from 1,000 to 30,000, and still more preferably from 1,000 to 10,000.

If any component having a compatibility with the phenoxy resin contained in the elastomer skeleton is in a too large quantity, it may make them dissolve mutually. Hence, its quantity may preferably be so determined that the phenoxy phase and the elastomer phase can be phase-separated. The quantity of such a component can be adjusted as desired, in accordance with the structure (SP value) of the phenoxy resin and the heat resistance and mechanical strength of the resin having been modified. For example, in the case of the butadiene-acrylonitrile copolymer, the content of acrylonitrile may preferably be set not more than 40% by weight, more preferably from 5 to 40% by weight, and still more preferably from 10 to 30% by weight. Commercially available products may be exemplified by HYCAR CTBN1300x31, HYCAR CTBN1300x8, HYCAR CTBN1300x13, HYCAR CTBNX1300x9, HYCAR CTBNX1009-SP and HYCAR CTB200x162 (available from Ube Industries, Ltd.); NIPOL DN 601 (available from Nippon Zeon Co., Ltd.); Nisso PB, C-1000 and C-2000 (available from Nippon Soda Co., Ltd.); and ELC-4 (available from Japan Synthetic Rubber Co., Ltd.).

When the molding material for encapsulating of the present invention is used for electronic component devices such as semiconductor devices, ionic impurities in the material may preferably be made as less as possible. Accordingly, in the carboxyl-group-containing elastomer, too, alkali metal ions such as $Na^+$ and $K^+$ may preferably be not more than 10 ppm, and more preferably not more than 5 ppm, and $Cl^-$ ions may preferably be not more than 400 ppm, more preferably not more than 100 ppm, and still more preferably not more than 40 ppm.

The phase-separated structure of the present invention can be produced, e.g., in the following way.

First, the above phenoxy resin is dissolved in a solvent, then the above carboxyl-group-containing elastomer is dissolved in it (the volume ratio of the phenoxy resin to the elastomer may be set at any ratio in accordance with target values for the flexibility, toughness and adhesion strength of cured products that are required in their intended uses, and the ratio of phenoxy resin to elastomer may preferably be within the range of from 60:40 to 90:10, and more preferably within the range of from 66:33 to 87:13.).

The solvent used when the phase-separated structure is produced may be any of solvents so long as they are solvents capable of dissolving the phenoxy resin and carboxyl-group-containing elastomer. When a blocked isocyanate described later is added to the solution formed after heat-mixing, the solvent must be inert to the isocyanate group.

Next, after gas dissolved in the solution is thoroughly displaced with nitrogen, the solution is stirred and mixed while heating it at 100° C. to 220° C., and preferably about 130° C. to 180° C. in the atmosphere of nitrogen, until it becomes semitransparent or transparent and preferably comes to have a viscosity at a constant value. The heat-mixing may preferably be carried out while refluxing the solvent.

The solution of elastomer-modified phenoxy resin which is obtained after the heat-mixing is completed may be purified by reprecipitation using a bad solvent such as methanol to obtain the product as a solid phase-separated structure. The mechanism of modification is unclear. However, $^1$H-NMR spectroscopy made before and after the modification has ascertained that the integral value corresponding to protons of the methine bonded to the hydroxyl group in the phenoxy resin skeleton has lessened after the modification. FT-IR (Fourier-transform infrared absorption) spectroscopy has also ascertained that remarkable changes have occurred in spectra in the regions of from 3,460 $cm^{-1}$ to 3,560 $cm^{-1}$ and from 1,610 $cm^{-1}$ to 1,640 $cm^{-1}$, which are not seen in a solution in which the elastomer is merely blended. From these facts, it is considered that at least part of carboxyl groups of the carboxyl-group-containing elastomer and at least part of hydroxyl groups in the phenoxy resin have formed an ester linkage.

In the elastomer-modified phenoxy resin thus obtained, the phenoxy resin and the carboxyl-group-containing elastomer stand phase-separated, and a transparent or semitransparent film form can be produced from this phase-separated structure alone. This structure has a light transmittance of 10% or more of the light transmittance of air at a wavelength of 500 nm, as the film form of 75 μm in layer thickness. The light transmittance may more preferably be from 20 to 90%, and still more preferably from 30 to 85%.

The formation of phase separation can be confirmed by observation with a scanning or transmission electron microscope or an atomic-force microscope, by dynamic-viscoelasticity measurement, by light-scattering or by X-ray small-angle scattering ("Polymer Blends", pages 80–124, published by CMC Co.). For example, in the dynamic-viscoelasticity measurement, it may be confirmed that the tan δ (loss elastic modulus G"/storage elastic modulus G') peak of the main dispersion of an elastomer phase and the tan δ peak of the main dispersion of a phenoxy resin phase are present independently.

The phase-separated structure of the present invention may preferably stand a microphase-separated structure in which, in a scanning electron microscope image of its film form, the elastomer phase and the phenoxy resin phase are dispersed in the form of fine particles of the submicron order of from about 0.1 to 0.3 μm. The film form of such a phase-separated structure can be optically transparent or semitransparent. That is, the 75 μm thick film form of the phase-separated structure of the present invention has a light transmittance of 10% or more of the light transmittance of air at a wavelength of 500 nm.

The phase-separated structure of the elastomer-modified phenoxy resin obtained in the present invention may include structures as exemplified by the microphase-separated structure of the elastomer phase and phenoxy resin phase and a microphase-separated structure in which microdomains are connected. These structures are not conventionally known in the mixing of carboxyl-group-containing elastomers and phenoxy resins. Such a phase-separated structure is considered to be one factor to improve the adhesion strength to adherends.

The elastomer-modified phenoxy resin or resin composition of the present invention can be used as film materials. A solution of the elastomer-modified phenoxy resin or resin composition, prepared by dissolving it in an amide type solvent, an ether type solvent, a ketone type solvent, a lactone type solvent or an alcohol type solvent, may be heated to evaporate the solvent, thus a film form can be obtained. The solution may be heated at any temperature so long as the solvent evaporates, and usually may be heated at a temperature ranging from 40 to 200° C., and preferably from 60 to 170° C. In an instance where any abrupt heating may cause escape of the air contained in the elastomer-modified phenoxy resin to tend to form pinhole-like marks (i.e., voids), the solution may be heated while raising the temperature gradually from a low temperature to evaporate the solvent, in order to make the voids less occur.

When the elastomer-modified phenoxy resin of the present invention is used in adhesives or encapsulating molding materials, an epoxy resin may preferably be used in combination.

As the epoxy resin, which is used as the component (A) of the resin composition or encapsulating molding material of the present invention, a compound having two or more epoxy groups in the molecule may be used, as exemplified by;

bisphenol-A epoxy resin, bisphenol-F epoxy resin, bisphenol-AD epoxy resin and bisphenol S epoxy resin; and alkylene oxide addition products, halides or hydrogenated products of these, any of these into the aromatic ring of the phenolic skeleton of which a straight-chain alkyl group, a branched alkyl group, a methylol group, an allyl group, a cyclic aliphatic group, a halogen or a nitro group has been introduced, and any of these into the carbon atom present at the center of the bisphenolic skeleton of which a straight-chain alkyl group, a branched alkyl group, an allyl group, a substituted allyl group, a cyclic aliphatic group or an alkoxycarbonyl group has been introduced;

epoxidation products of novolak resins obtained from phenols and aldehydes, including phenol novolak epoxy resins and o-cresol novolak epoxy resins;

glycidylamine epoxy resins obtained by the reaction of a polyamine such as diaminodiphenylmethane, methaxylenediamine, diaminomethylcyclohexane or isocyanuric acid with epichlorohydrin;

glycidyl ether epoxy resins such as triphenylglydicyl ether ethane and tetraphenylglydicyl ether ethane; and glycidyl ester epoxy resins obtained by the reaction of a carboxylic acid with epichlorohydrin, including phthalic diglycidyl esters, tetrahydrophthalic diglycidyl esters, hexahydrophthalic diglycidyl esters, polymerized fatty acid polyglycidyl esters;

cyclic aliphatic epoxy resins obtained by epoxidized by the oxidation of double bonds of cyclohexene rings with peracetic acid or the like;

linear aliphatic epoxy resins obtained by the oxidation of olefinic bonds with peracetic acid or the like;

hydantoin epoxy resins obtained by the glycidylation of hydantoin rings, such as diglycidylhydantoin and glycidylglycidoxyalkylhydantoins; and polysulfide-modified epoxy resins having a polysulfide skeleton.

As commercially available special epoxy resins other than these, biphenyl epoxy resins (YX-4000H, available from Yuka Shell Epoxy K.K.); E-XL-3L, E-OCX-3L, SPI-DG (trade names; available from Mitsui Toatsu Chemicals, Inc.); EXA-7200, EXA-4750, EXA-4700, HP-4032 (trade names; available from Dainippon Ink & Chemicals, Inc.); EPPN-502, NC-7000 (trade names; available from Nippon Kayaku Co., Ltd.); and ESN-175, ESN-375, ESLV-80XY, ESLV-9OCR, ESLV-120TE, ESLV-80DE (trade names; available from Nippon Steel Chemical Co., Ltd.) may also be used.

These epoxy resins may have a weight-average molecular weight of 5,000 or less, and particularly preferably 3,000 or less. The quantity of impurities contained in these epoxy resins, in particular, the quantity of hydrolyzable chlorine concerns the corrosion of aluminum wiring on devices such as ICs (integrated circuits) and may preferably be as small as possible. The total chlorine may be in a content of 1,000 ppm or less, and preferably 800 ppm or less, and the hydrolyzable chlorine may be in a content of 500 ppm or less, and preferably 300 ppm or less. Such epoxy resins may preferably be used. Here, the content of hydrolyzable chlorine is measured as a value determined by potentiometric titration of a solution prepared by dissolving 1 g of a sample epoxy resin in 30 ml of dioxane, and adding thereto 5 ml of a 1N-KOH methanol solution followed by reflux for 30 minutes.

Any of these epoxy resins may be used alone or in combination of two or more.

The content of the epoxy resin used in the present invention is defined by the following expression (1):

$$[(A/a)]/[(A/a+B_1/b_1+B_2/b_2]\times 100 \ (\% \text{ by volume}) \qquad (1)$$

Here, A is part(s) by weight of the epoxy resin, a is specific gravity of the epoxy resin, $B_1$ is part(s) by weight of the elastomer charged, $b_1$ is specific gravity of the elastomer, $B_2$ is part(s) by weight of the phenoxy resin, and $b_2$ is specific gravity of the phenoxy resin. The epoxy resin content may be set as desired in accordance with the target values for the flexibility, toughness and adhesion strength, and may preferably be from 2 to 25% by volume, and more preferably from 4 to 20% by volume.

The content of elastomer in elastomer-modified phenoxy resin in the resin composition or encapsulating molding material of the present invention is what is called the charge of the elastomer, and is defined by the following expression (2):

$$[(B_1/b_1)]/[(A/a+B_1/b_1+B_2/b_2]\times 100 \ (\% \text{ by volume}) \qquad (2)$$

Here, A, a, $B_1$, $b_1$, $B_2$ and $b_2$ have the same meanings as those in the above expression (1). The elastomer content may also be set as desired in accordance with the target values for the flexibility, toughness and adhesion strength, and may preferably be from 10 to 35% by volume, and more preferably from 15 to 30% by volume.

The content of phenoxy resin in elastomer-modified phenoxy resin in the resin composition or encapsulating molding material of the present invention, is what is called the charge of the phenoxy resin, and is defined by the following expression (3):

$$[(B_2/b_2)]/[(A/a+B_1/b_1+B_2/b_2)]\times 100 \ (\% \text{ by volume}) \tag{3}$$

Here, A, a, $B_1$, $b_1$, $B_2$ and $b_2$ have the same meanings as those in the above expression (1). The phenoxy resin content may also be set as desired in accordance with the target values for the flexibility, toughness and adhesion strength, and may preferably be from 50 to 85% by volume, and more preferably from 55 to 80% by volume.

The curing agent for epoxy resin which is used as the component (C) in the resin composition or encapsulating molding material of the present invention may include epoxy resin curing agents such as;

resins obtained by the condensation or co-condensation of phenols (e.g., phenol, cresol, xylenol, hydroquinone, resorcin, catechol, bisphenol A and bisphenol F) or naphthols (e.g., α-naphthol, β-naphthol and hydroxynaphthalene) with aldehydes (e.g., formaldehyde, acetaldehyde, propionaldehyde, benzaldehyde and salicylaldehyde) under an acid catalyst;

phenol-aralkyl resins having a xylylene skeleton, synthesized from phenols and dimethoxy-p-xylene;

phenol compounds such as phenol resins having a dicyclopentadiene skeleton and naphthol resins having a xylylene skeleton;

acid anhydrides such as phthalic anhydride, tetrahydrophthalic anhydride, hexahydrophthalic anhydride, methyltetrahydrophthalic anhydride, methylhexahydrophthalic anhydride, methylnadic anhydride and dodecylsuccinic anhydride; and polyamine compounds such as diethylenetriamine, triethylenetriamine, tetraethylenepentamine, diethylaminopropylamine, menthenediamine, isophoronediamine, N-aminoethylpiperazine, metaxylenediamine, diaminodiphenylmethane, diaminodiphenylsulfone, m-phenylenediamine, dicyandiamide, and polyamide-polyamine. Of these, phenol compounds such as phenol novolak resins are preferred in view of superior heat resistance and moisture resistance of the cured products.

Any of these curing agents may usually be used in a quantity determined by stoichiometric quantity, which, however, may appropriately be determined according to the balance of the heat resistance, mechanical properties, electrical properties and adhesion. Stated specifically, the phenol compound may be used in such a quantity that the aromatic hydroxyl group is preferably in an equivalent weight of from 0.5 to 2.0, and more preferably in an equivalent weight of from 0.7 to 1.2, per equivalent weight of the epoxy group. When the acid anhydride is used, the acid anhydride group may preferably be in an equivalent weight of from 0.5 to 2.0, and more preferably in an equivalent weight of from 0.7 to 1.2, per equivalent weight of the epoxy group. The polyamine compound except dicyandiamide and polyamide-polyamine may be used in such a quantity that the active hydrogen is preferably in an equivalent weight of from 0.5 to 2.0, and more preferably in an equivalent weight of from 0.8 to 1.2, per equivalent weight of the epoxy group. The dicyandiamide may be used in an amount of from 4 to 11 parts by weight based on 100 parts by weight of the epoxy resin. The polyamide-polyamine may used in an amount of from 50 to 160 parts by weight based on 100 parts by weight of the epoxy resin.

In the elastomer-modified resin and resin composition of the present invention, in view of heat resistance and solvent resistance, a compound having two or more functional groups capable of reacting with the hydroxyl group in the phenoxy resin may preferably be used to cross-link the elastomer-modified resin. This compound for cross-linking may preferably be a blocked isocyanate in view of storage stability of the elastomer-modified resin and resin composition. The component-(D) curing agent for the phenoxy resin used in the present invention is also a compound having in the molecular structure two or more functional groups capable of reacting with the hydroxyl group in the phenoxy resin and, in view of storage stability of the encapsulating material, may preferably be a blocked isocyanate.

As an isocyanate compound in the blocked isocyanate, it may include compounds having two or more isocyanato groups in the molecule as exemplified by toluene diisocyanate, isophorone diisocyanate, 1,5-naphthalene diisocyanate, tolidine diisocyanate, hexamethylene diisocyanate, trimethylhexamethylene diisocyanate, xylylene diisocyanate, hydrogenated xylylene diisocyanate, metaphenylene diisocyanate, hydrogenated metaphenylene diisocyanate, p-phenylene diisocyanate, tetramethylxylene diisocyanate, triphenylmethane triisocyanate, tris (isocyanatophenyl) thiophosphate, 1,6,11-undecan triisocyanate, 1,8-diisocyanato-4-isocyanato methyloctane, 1,3,6-hexamethylene triisocyanate, bicyloheptane triisocyanate, and isomers, alkyl-substituted compounds or halides of these. Triisocyanate compounds or tetraisocyanate compounds formed by further introducing isocyanato group (s) into the diisocyanate compound may also be used. Any of these isocyanate compounds may be used alone or in combination of two or more.

As a blocking agent for the blocked isocyanate, it may include compounds containing active hydrogen capable of reacting with the isocyanato group, as exemplified by;

phenolic compounds such as phenol, cresol, xylenol, trimethylphenol, butylphenol, phenylphenol, naphthol, hydroquinone, resorcinol, catechol, bisphenol A, bisphenol F, bisphenol AD, 4,4'-bisphenol, novolak resins such as phenolic novolak having 2 to 5 nuclei on the average and o-cresol novolak, naphthol resins, phenolic resins having a xylylene skeleton, phenolic resins having a cyclopentadiene skeleton, and naphthol resins having a xylylene skeleton;

alcohol compounds such as methyl cellosolve, butyl cellosolve, propyleneglycol monomethyl ether, benzyl alcohol, 2-ethylhexanol, benzyl alcohol and cyclohexanol;

active methylene compounds such as dimethyl malonate, diethyl malonate, methyl acetoacetate, ethyl acetoacetate and acetylacetone;

acid amide compounds such as acetanilide, acetamide, ε-caprolactam, δ-valerolactam and γ-butyrolactam;

acid imide compounds such as succinimide and maleimide;

imidazole compounds such as imidazole, 2-methylimidazole, 2-ethylimidazole, 2-ethyl-4-methylimidazole and 2-phenylimidazole;

oxime compounds such as formaldoxime, acetaldoxime, methyl ethyl ketoxime, methyl isobutyl ketoxime, methyl isoamyl ketoxime and cyclohexanone oxime; and amines such as phenylnaphthylamine, diphenylamine, aniline and carbazole, or imine compounds such as ethyleneimine compounds and polyethyleneimine compounds. Of these, phenol compounds, oxime compounds, alcohol compounds and lactam compounds are preferred.

The blocking reaction to form the blocked isocyanate may be carried out irrespective of the presence or absence of solvents. When solvents are used, it is necessary to use solvents inert to the isocyanato group. The blocking reaction may usually be carried out at −20 to 150° C., and preferably at 0 to 100° C. Reaction at a too high temperature may cause side reaction. Reaction at a too low temperature may result in a low reaction rate and is disadvantageous. The isocyanate may preferably be so blocked as to have substantially no active isocyanato groups. In the blocking reaction, an organic metal salt or a tertiary amine may be used as a catalyst.

The blocked isocyanate may be mixed in such a quantity that the ratio of the isocyanato group equivalent weight to the hydroxyl group equivalent weight of the phenoxy resin is 1 or less, in accordance with the target values for the flexibility, toughness and adhesion strength that are required in the intended uses. Especially when heat resistance, toughness and solvent resistance are to be imparted, the ratio of the isocyanato group equivalent weight to the hydroxyl group equivalent weight of the phenoxy resin may preferably be within the range of from 0.05 to 0.8, and more preferably within the range of from 0.1 to 0.7. When both the high adhesion and the strength are to be achieved in a well balanced state, the ratio may preferably be within the range of from 0.01 to 0.5, more preferably from 0.05 to 0.5, and still more preferably within the range of from 0.05 to 0.3.

As a curing accelerator for the epoxy resin, usable are;

diazabicycloalkene such as 1,8-diazabicyclo(5,4,0)undecene-7, and derivatives thereof;

tertiary amines such as triethylamine, triethylenediamine, benzyldimethylamine, triethanolamine, dimethylaminoethanol, dimethylaminomethylphenol and tris(dimethylaminomethyl)phenol;

imidazoles such as 2-methylimidazole, 2-ethyl-4-methylimidazole, 2-phenylimidazole, 2-phenyl-4-methylimidazole, 2-heptadecylimidazole, 1-benzyl-2-methylimidazole, 1-cyanoethyl-2-methylimidazole, 1-cyanoethyl-2-ethyl-4-methylimidazole and 1-cyanoethyl-2-phenylimidazole;

organophosphines such as tributylphosphine, methyldiphenylphosphine, triphenylphosphine, diphenylphosphine and phenylphosphine; and tetraphenylboron salts such as tetraphenylphosphonium tetraphenylborate, triphenylphosphine tetraphenylborate, 2-ethyl-4-methylimidazole tetraphenylborate and N-methylmorphorine tetraphenylborate, or $BF_3$-amine complexes.

As a curing accelerator for the phenoxy resin, various metal compounds may also be used, such as zinc naphthenate, lead naphthenate, lead 2-ethylhexoate, cobalt 2-ethylhexoate, tin octoate, zinc octoate and antimony trioxide.

Any of these curing agents and curing accelerators may be used alone or in combination of two or more.

The component-(E) inorganic filler used in the present invention may include, e.g., powders of fused silica, crystal silica, alumina, zircon, calcium silicate, calcium carbonate, silicon carbide, boron nitride, beryllia and zirconia, or beads formed by making these spherical, single-crystal fibers of potassium titanate, silicon carbide, silicon nitride and alumina, and glass fibers, one or more of which may be mixed. In particular, in view of providing a small coefficient of linear expansion, silica may preferably be used, and, in view of providing a high heat conductivity, alumina may preferably be used. Aluminum hydroxide, magnesium hydroxide, zinc borate or the like may also be used as a flame-retardant filler.

The filler may have a spherical particle shape. This is because it can provide, in the same fill, a lower viscosity than fillers having different particle shapes, a spherical filler can be used in a higher fill at the same viscosity to enable the cured product to have a smaller coefficient of linear expansion, a spherical filler may hardly cause mechanical damage to the members to be encapsulated, and the cured product can have a smoother surface.

The filler may preferably have an average particle diameter of from 0.1 to 15 $\mu$m, and more preferably from 0.5 to 10 $\mu$m. Here, the average particle diameter is indicated as a size measured by laser diffractometry (D50).

If the filler has an average particle diameter larger than 15 $\mu$m, the filler may have a low uniformity of dispersion in its particle size distribution to have a large maximum particle diameter, and may produce fine irregularities on the film surface to tend to make surface smoothness poor. If it has an average particle diameter smaller than 0.1, its particles are so fine as to tend to agglomerate in the material, tending to result in a low dispersibility. Consequently, fine irregularities may appear on the film surface to tend to make surface smoothness poor.

In the particle size distribution of the filler, particles with particle diameters of 25 $\mu$m or smaller may preferably be in a content of 90% by weight or more, and more preferably 95% by weight or more. If they are in a content less than 90% by weight, a poor surface smoothness may result undesirably.

The filler may preferably have a specific surface area of from 0.4 to 20 m$^2$/g, and more preferably from 0.6 to 15 m$^2$/g. If its specific surface area is larger than 20 m$^2$/g, a low moisture absorption may result undesirably. If it is smaller than 0.4 m$^2$/g, the cured product may have a low adhesion to film tapes undesirably. Any of these fillers may be used alone, or in combination of two or more fillers having different average particle diameters.

The inorganic filler may be mixed in any desired quantity in accordance with properties. It may preferably be mixed in an amount of from 30% by volume to 90% by volume based on the total solid content, and more preferably from 50% by weight to 80% by weight from the viewpoints of achievement of a low moisture absorption, achievement of a low coefficient of linear expansion, improvement in molding properties and improvement in strength. When a thixotropy is to be imparted to the resin composition, ultrafine silica particles may further be added in a small quantity in accordance with the desired thixotropy index.

The filler used in the present invention may optionally be surface-treated with a known coupling agent such as a silane coupling agent.

The organic solvent used in the present invention is a solvent that can dissolve or disperse the phenoxy resin, the phenoxy resin modified with a carboxyl-group-containing elastomer, the epoxy resin and the above curing agents and other additives to mix them. For example, usable are;

amide type solvents such as N,N-dimethylacetamide, N,N-diethylacetamide, N,N-dimethylformamide, N,N-diethylformamide, formamide, N-methylformamide, N-methylacetamide and N-methylpyrrolidone;

ether type solvents such as ethylene glycol diethyl ether, ethylene glycol dipropyl ether, ethylene glycol dibutyl ether, ethylene glycol monomethyl ether acetate, ethylene glycol monoethyl ether acetate, ethylene glycol monobutyl ether acetate, dipropylene glycol methyl ether acetate, diethylene glycol dimethyl ether, diethylene glycol diethyl ether, diethylene glycol dibutyl ether, diethylene glycol monomethyl ether acetate, diethylene glycol monoethyl ether acetate, diethylene glycol monobutyl ether acetate, and diethylene glycol diacetate;

ketone type solvents such as cyclohexanone, 2-methylcyclohexanone, 3-methylcyclohexanone, 4-methylcyclohexanone, 4-ethylcyclohexanone, 2-octanone, 3-octanone, 4-octanone, 2-nonanone, 3-nonanone, 4-nonanone and 5-nonanone;

lactone type solvents such as β-butyrolactone, γ-butyrolactone, β-valerolactone, δ-valerolactone and γ-valerolactone;

alcohol type solvents such as ethylene glycol monomethyl ether, ethylene glycol monoethyl ether, ethylene glycol monobutyl ether, diethylene glycol monomethyl ether, diethylene glycol monoethyl ether, and diethylene glycol monobutyl ether; and solvents such as ethylene glycol diacetate. Any of these solvents may be used alone or in combination of two or more.

The organic solvent may preferably have a boiling point of from 120° C. to 240° C., and more preferably from 140° C. to 220° C., at one atmospheric pressure. Solvents having a low boiling point below 120° C. may evaporate abruptly to tend to cause voids. Those having a boiling point above 240° C. may make precure time longer and also may make it necessary to heat the product at a high temperature for a long time in order to make the solvent not remain in the cured product.

Precuring conditions may differ depending on the boiling point of the solvent. The use of a solvent having a boiling point within the above range enables precuring only by, e.g., one-stage heating at a precure temperature of 80 to 150° C. for 5 to 30 minutes. For example, when a solvent having a boiling point of 165° C. is used, the product becomes tack-free in a short time of 10 minutes at a precure temperature of 100° C. or 5 minutes at 110° C.; and when a solvent having a boiling point of 204° C. is used, in 10 minutes at a precure temperature of 105° C. or 5 minutes at 120° C.; where no voids are also seen. Incidentally, without limitation to such one-stage heating, heating temperature may be changed at two or more stages to cure the product.

The content of the solvent may be set as desired in accordance with the viscosity of molding materials, the film thickness and so forth. In the resin composition or molding material of the present invention, it may usually be set to be 70% by volume or less, preferably from 30 to 70% by volume, and more preferably from 35 to 60% by volume, based on the total volume. Also, the viscosity can be adjusted by changing the solvent quantity, the elastomer-modified phenoxy resin quantity, the epoxy resin quantity, the molecular weight of the phenoxy resin or elastomer constituting the elastomer-modified phenoxy resin, the compositional ratio of phenoxy resin to elastomer in the elastomer-modified phenoxy resin, the composition of the elastomer (e.g., the compositional ratio of acrylonitrile to butadiene in the case of acrylonitrile- butadiene resin), the particle size and quantity of the inorganic filler and the types and quantities of coupling agent, leveling agent, lubricant, sedimentation preventive agent, dispersant, surface-active agent and so forth.

When the blocked isocyanate is used as the curing agent, it is necessary to use solvents which are inert to the isocyanato group of the amide, ether, ketone or lactone compound. Such solvents may also be used as solvents when the phenoxy resin or the blocked isocyanate are synthesized, and the reaction solution containing the solvent may go into the resin composition.

As other additives, coupling agents such as isocyanatosilane, epoxysilane, aminosilane, ureidosilane, vinylsilane, alkylsilane, mercaptosilane, organotitanate and aluminum alcoholate may be used. There are no particular limitations on how to use these coupling agents. The coupling agent with which treats the inorganic filler may by used, or the agent may be used by integral blending when other materials are mixed. When a thixotropy is to be imparted to the resin composition, ultrafine silica particles, surface-treated calcium carbonate, bentonite, kaolin, clay or organic bentonite may be added in a small quantity in accordance with the desired thixotropy. Leveling agents, lubricants, sedimentation preventive agents, anti-foaming agents, dispersants, surface-active agents, ion-trapping agents, pigments such as carbon black, a titanium black pigment and organic dyes, flame-retardants, flame-retardant auxiliaries (e.g., antimony trioxide and antimony pentoxide) and so forth may further be optionally used.

The resin composition or molding material of the present invention can be prepared by dissolving or dispersing all of the materials uniformly. Here, any methods may be used so long as the materials can be dissolved or dispersed uniformly. Such methods may include, e.g., the use of apparatus such as automated mortars, three-roll mills, ball mills, planetary mixers and homomixers. Also, a method making use of a master batch in which mixing components such as the inorganic filler, the resins and the solvent have been pre-dispersed in appropriate quantities is preferred in view of uniform dispersibility and surface smoothness.

Using the molding material for encapsulating electronic components according to the present invention, electronic component devices such as semiconductor devices having a high reliability can be obtained. Stated specifically, they are electronic component devices including semiconductor packages such as TCPs (tape carrier packages), BGAs (ball grid arrays) and CPSs (chip size packages), COB (chip on board) modules, COG (chip on glass) modules, hybrid ICs and multi-chip modules to which i) semiconductor chips such as liquid-crystal driving ICs, memory ICs, central processing unit (CPU) LSIs, digital signal processing unit (DSP) LSIs, analog processing devices and communication control devices which have been connected to the wiring or pad areas of support members such as lead frames, wired tape carriers, wiring boards, glass sheets and silicon wafers by wire bonding or through solder bumps or gold bumps, ii) active elements such as transistors, diodes, thyristors thermistor and varistors, iii) passive elements such as capacitors, resistors, coils and transformers and/or iv) electronic components such as switches and connectors have been connected and necessary areas of which have been encapsulated with the molding material for encapsulating electronic components according to the present invention. In particular, the present invention can exhibit the best performance in TCPs.

The electronic component devices including these semiconductor packages and various modules are mounted on household electric appliances, business-purpose electronic machinery and so forth. For example, TCPs and COG modules are used in televisions making use of liquid-crystal display, personal computers, memory cards, facsimile machines and so forth, and BGAs and CSPs are used in portable telephones, portable video recorders, electronic cameras, personal computers and so forth.

BEST MODES FOR WORKING THE INVENTION

Figure 1:
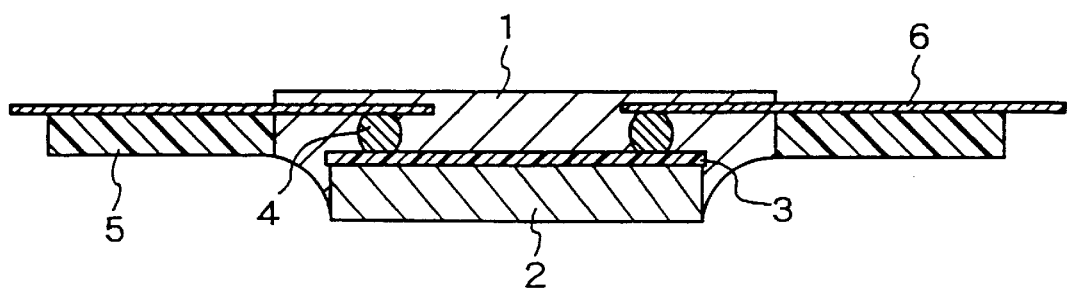
FIG. 1 is a cross-sectional view of a TCP making use of the molding material for encapsulating electronic components according to the present invention. Molding material 1 encapsulates semiconductor device 2 combined with polyimide 3, bumps 4, tape carrier 5 and leads 6.

Examples of the present invention will be described below with reference to the drawing. The present invention is by no means limited to these.

Synthesis Example 1

(Synthesis 1 of phenoxy resin)

Into a 2-liter four-necked flask provided with a nitrogen feed pipe, a thermometer, a condenser and a mechanical stirrer, 333.83 g of tetrabromobisphenol A (FG-2000, available from Teijin Chemicals Ltd.), 205.56 g of bisphenol A epoxy resin (YD-8125, a molecular distillation product; epoxy equivalent weight: 172 g/equivalent weight; available from Tohto Kasei Co., Ltd.) and 1,257 g of N,N-dimethylacetamide were introduced, and were stirred and mixed in an atmosphere of nitrogen until a uniform mixture was formed.

Next, 0.94 g of lithium hydroxide was added, and the reaction was carried out at 120° C. for 9 hours while raising the temperature thereto gradually. The reaction was traced by measuring the viscosity of the reaction solution at intervals of a given time, and the reaction was carried out until the viscosity no longer increased.

After the reaction was completed, the reaction solution was left to cool, and about 420 g of active alumina (200 mesh) was added thereto, followed by leaving overnight. The active alumina was filtered to obtain an N,N-dimethylacetamide solution of the desired phenoxy resin 1. Also, a portion of the filtrate (reaction solution) was poured into a large quantity of methanol to cause solid resin to precipitate, followed by washing with methanol and then drying under reduced pressure to form a phenoxy resin for measuring molecular weight.

Weight-average molecular weight of the resultant resin in terms of polystyrene was measured by gel permeation chromatography (columns: TSKgel G5000HXL+TSKgel G2000HXL, trade names; available from Tosoh Corp.; eluting solution: tetrahydrofuran; sample concentration: 0.5% by weight) to find that the weight-average molecular weight was 58,000.

The phenoxy resin 1 thus synthesized comprises a repeating unit having a structure represented by the formula (V).

Weight-average molecular weight of the resultant resin in terms of polystyrene as measured by gel permeation chromatography (columns: TSKgel G5000HXL+TSKgel G2000HXL, trade names; available from Tosoh Corp.; eluting solution: tetrahydrofuran; sample concentration: 0.5% by weight) was 32,600.

Synthesis Example 3

(Synthesis 3 of phenoxy resin)

Into a 2-liter four-necked flask provided with a nitrogen feed pipe, a thermometer, a condenser and a mechanical stirrer, 335.51 g of tetrabromobisphenol A (FG-2000, available from Teijin Chemicals Ltd.), 205.58 g of bisphenol A epoxy resin (YD-8125, a molecular distillation product; epoxy equivalent weight: 174.4 g/equivalent weight; available from Tohto Kasei Co., Ltd.) and 1,262.54 g of N,N-dimethylacetamide were introduced, and were stirred and mixed in an atmosphere of nitrogen until a uniform mixture was formed.

Next, 0.943 g of lithium hydroxide was added, followed by heating at 120° C. for 7 hours to obtain phenoxy resin 3 in the same manner as in Synthesis Example 1.

Weight-average molecular weight of the resultant resin in terms of polystyrene as measured by gel permeation chromatography (columns: TSKgel G5000HXL+TSKgel G2000HXL, trade names; available from Tosoh Corp.; eluting solution: tetrahydrofuran; sample concentration: 0.5% by weight) was 40,400.

EXAMPLE 1

(Preparation 1 of phenoxy resin modified with carboxyl-group-containing butadiene elastomer)

Into a 1-liter four-necked flask provided with a nitrogen feed pipe, a thermometer, a condenser and a mechanical stirrer, 807.62 g of the N,N-dimethylacetamide solution of the phenoxy resin 1, obtained in Synthesis Example 1, and 50.88 g of a terminal carboxyl-group-containing butadiene-

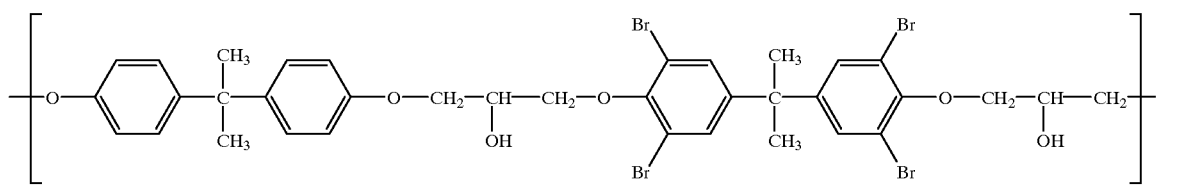

(V)

Synthesis Example 2

(Synthesis 2 of phenoxy resin)

Into a 2-liter four-necked flask provided with a nitrogen feed pipe, a thermometer, a condenser and a mechanical stirrer, 342.64 g of tetrabromobisphenol A (FG-2000, available from Teijin Chemicals Ltd.), 205.56 g of bisphenol A epoxy resin (YD-8125, a molecular distillation product; epoxy equivalent weight: 172 g/equivalent weight; available from Tohto Kasei Co., Ltd.) and 1,281.32 g of N,N-dimethylacetamide were introduced, and were stirred and mixed in an atmosphere of nitrogen until a uniform mixture was formed.

Next, 0.934 g of lithium hydroxide was added, followed by heating at 120° C. for 7 hours to obtain phenoxy resin 2 in the same manner as in Synthesis Example 1.

acrylonitrile copolymer (Hycar CTBNX1009-SP, available from Ube Industries, Ltd.) were introduced, and then the gas dissolved in the solution was thoroughly displaced with nitrogen while stirring and mixing them.

Next, with stirring and mixing in the atmosphere of nitrogen, the mixture was heated for 8.5 hours while raising the temperature gradually, then, refluxing the solvent, thus an N,N-dimethylacetamide solution of the desired elastomer-modified phenoxy resin 1 was obtained. The solution thus obtained was a brown and transparent solution, and had a viscosity of about 300 cP as measured with a cone plate type viscometer (EMD Type, manufactured by Tokimec Inc.). A portion of the reaction solution was poured into a large quantity of methanol to cause solid matter to precipitate, followed by washing with methanol and then drying under reduced pressure to obtain an elastomer-modified phenoxy resin of Example 1.

Weight-average molecular weight of the resultant elastomer-modified phenoxy resin in terms of polystyrene was measured by gel permeation chromatography (columns: TSKgel G5000HXL+TSKgel G2000HXL, trade names; available from Tosoh Corp.; eluting solution: tetrahydrofuran; sample concentration: 0.5%) to find that it was 36,000.

EXAMPLES 2 to 4

(Preparation 2 of phenoxy resin modified with carboxyl-group-containing butadiene elastomer)

Into a 2-liter four-necked flask provided with a nitrogen feed pipe, a thermometer, a condenser and a mechanical stirrer, 1,144.04 g of the N,N-dimethylacetamide solution of the phenoxy resin obtained in Synthesis Example 3 and 72.07 g of a terminal carboxyl-group-containing butadiene/acrylonitrile copolymer (Hycar CTBNX1009-SP, available from Ube Industries, Ltd.) were introduced, and then the gas dissolved in the solution was thoroughly displaced with nitrogen while stirring and mixing them.

Next, with stirring and mixing in the atmosphere of nitrogen, the solvent was refluxed after raising the temperature gradually. The reaction solution was batched off at 1.5 hours, 3 hours and 7 hours, respectively, after the start of reflux, to obtain N,N-dimethylacetamide solutions of elastomer-modified phenoxy resins of Examples 2 to 4. The solution obtained after the heating for 7 hours was a brown and transparent solution.

Comparative Examples 1 to 4

The N,N-dimethylacetamide solution of the phenoxy resin obtained in Synthesis Example 1 was poured into a large quantity of methanol to cause solid resin to precipitate, followed by washing with methanol and then drying under reduced pressure to obtain a phenoxy resin of Comparative Example 1.

100 parts by weight of the phenoxy resin of Comparative Example 1 and 21 parts by weight of a terminal carboxyl-group-containing butadiene/acrylonitrile copolymer (Hycar CTBNX1009-SP, available from Ube Industries, Ltd.; acrylonitrile content: 17%) were added and mixed in γ-butylolactone to obtain a 34% by weight γ-butylolactone solution of a simply elastomer-blended mixture of Comparative Example 2.

The N,N-dimethylacetamide solution of the phenoxy resin obtained in Synthesis Example 2 was poured into a large quantity of methanol to cause solid resin to precipitate, followed by washing with methanol and then drying under reduced pressure to obtain a phenoxy resin. Then, 100 parts by weight of this phenoxy resin and 21 parts by weight of a terminal carboxyl-group-containing butadiene/acrylonitrile copolymer (Hycar CTBNX1009-SP, available from Ube Industries, Ltd.; acrylonitrile content: 17%) were added and mixed in γ-butylolactone to obtain a 34% by weight γ-butylolactone solution of a simply elastomer-blended mixture of Comparative Example 3.

1,144.04 g of an N,N-dimethylacetamide solution of the phenoxy resin obtained in Synthesis Example 3 and 72.07 g of a terminal carboxyl-group-containing butadiene/acrylonitrile copolymer (Hycar CTBNX1009-SP, available from Ube Industries, Ltd.; acrylonitrile content: 17%) were stirred and mixed in an atmosphere of nitrogen to obtain an N,N-dimethylacetamide solution of a simply elastomer-blended mixture of Comparative Example 4.

Properties of the elastomer-modified phenoxy resins of Examples 1 to 4 and phenoxy resin or its mixtures of Comparative Examples 1 to 4 were evaluated in the following way.

(1) Measurement of light transmittance:

A 30% by weight of γ-butylolactone solution of the elastomer-modified phenoxy resin of Example 1, N,N-dimethylacetamide solutions of the elastomer-modified phenoxy resins of Examples 2 to 4, a 30% by weight of γ-butylolactone solution of the phenoxy resin of Comparative Example 1 and the simply elastomer-blended mixtures of Comparative Examples 2 to 4 were each casted over a release-treated glass plate to which a spacer of about 300 μm thick was attached.

These were heated at 70° C. for 20 minutes, at 90° C. for 20 minutes and then at 120° C. for 2 hours to evaporate the solvent to obtain film forms of 75 μm in layer thickness. Light transmittance of the film forms at a wavelength of 500 nm with respect to air was measured with an autographic spectrophotometer (U-3410, manufactured by Hitachi Ltd.).

(2) Measurement of adhesion (peel) strength:

A 30% by weight of γ-butylolactone solution of the elastomer-modified phenoxy resin of Example 1, N,N-dimethylacetamide solutions of the elastomer-modified phenoxy resins of Examples 2 to 4, a 30% by weight of γ-butylolactone solution of the phenoxy resin of Comparative Example 1 and the simply elastomer-blended mixtures of Comparative Examples 2 to 4 were each casted over the side A and side B (specified by the manufacturer) of a polyimide tape (UPILEX 75S, available from Ube Industries, Ltd.) with a layer thickness of 75 μm to which a spacer of about 300 μm thick was attached. Then, these were heated at 70° C. for 20 minutes, at 90° C. for 20 minutes and then at 120° C. for 2 hours to evaporate the solvent to form various film forms on polyimide tapes.

The polyimide tapes with films were fixed and the films were drawn out using a tensile tester (RTM-100, manufactured by Orientec K.K.) to measure film-to-polyimde tape adhesion strength (90-degree peel strength).

The results of evaluation are shown in Table 1. In Table 1, since in Examples 1 to 4 the film and the polyimide tape did not separate at the interface between them, the peel strength in Example 1 to 4 indicates tensile strength at break of the films.

TABLE 1

| | Evaluation items | | |
| --- | --- | --- | --- |
| | Light transmittance | Peel strength (g/10 mm) | |
| Resin | (%) | Side A | Side B |
| Example 1 | 82.3 | 1,260 | 1,280 |
| Example 2 | 10.7 | 1,070 | 1,090 |
| Example 3 | 33.1 | 1,090 | 1,080 |
| Example 4 | 78.6 | 1,150 | 1,150 |
| Comparative Example 1 | 86.1 | 49 | 71 |
| Comparative Example 2 | 0.23 | 185 | 250 |
| Comparative Example 3 | 0.24 | 160 | 205 |
| Comparative Example 4 | 0.23 | 176 | 227 |

Synthesis Example 4

(Synthesis of methyl ethyl ketoxime blocked isocyanate)

Into a 500-ml four-necked flask provided with a nitrogen feed pipe, a dropping funnel, a thermometer, a condenser and a mechanical stirrer, 69.75 g of metaphenylenediisocyante (Millionate MT, available from Nippon Polyurethane Industry Co., Ltd.) and 196.95 g of cyclohexanone were introduced, and were stirred and mixed while heating to 55° C. in an atmosphere of nitrogen.

Next, 51 g of methyl ethyl ketoxime was dropwise added over a period of about 30 minutes, and the reaction was carried out at 55° C. for 5 hours to obtain a blocked isocyanate/cyclohexanone solution.

EXAMPLE 5

100 parts by weight of a flexible epoxy resin (XB4122, available from Asahi-CIBA Limited; epoxy equivalent weight: 336 g/equivalent weight; specific gravity: 1.08), 1,541 parts by weight of an N,N-dimethylacetamide solution of the elastomer-modified phenoxy resin of Example 1 (phenoxy resin content: 435 parts by weight; phenoxy resin specific gravity: 1.65; elastomer content: 91 parts by weight; elastomer specific gravity: 0.95), 62 parts by weight of a solution prepared by dissolving 31 parts by weight of phenol novolak resin (H-400, available from Meiwa Plastics Industry Ltd.; hydroxyl group equivalent weight: 106 g/equivalent weight) in 31 parts by weight of an N,N-dimethylacetamide solution, 55 parts by weight of the blocked isocyanate/cyclohexanone solution obtained in Synthesis Example 4 (blocked isocyanate content: 21 parts by weight), 1.5 parts by weight of 2-ethyl-4-methylimidazole tetraphenylborate (EMZ-K, available from Hokko Chemical Industry Co., Ltd.), 1,614 parts by weight of spherical fused silica having an average particle diameter of 8 $\mu$m (specific surface area: 2.0 $m^2/g$), 2.5 parts by weight of γ-ureidopropyltriethoxylsilane (AY43-031, available from Dow Corning Toray Silicone Co., Ltd.), 8 parts by weight of isocyanatopropyltriethoxysilane (KBE-9007, available from Shin-Etsu Chemical Co., Ltd.) and 14 parts by weight of an organic black dye (VALIFAST BLACK 3820, available from Orient Chemical Industries, Ltd.) were mixed, and were stirred and blended under reduced pressure for 25 minutes using an automated mortar (manufactured by Ishikawa MFG. Co., Ltd.).

The sealing molding material for encapsulating thus obtained had a viscosity of about 33 P (20 rpm). This was casted over the side A (specified by the manufacturer) of a polyimide film (UPILEX 75S, available from Ube Industries, Ltd.) with a layer thickness of 75 $\mu$m to which a spacer of about 300 $\mu$m thick was attached. A cured product formed after heating at 90° C. for 20 minutes and then at 150° C. for 3 hours was examined on its peel strength to the polyimide film to find that it was 800 g/25 mm at room temperature and 1,600 g/25 mm at 120° C., and had a high adhesion over a broad temperature region.

The cured product obtained was put to a pressure cooker test (PCT). As a result, the peel strength of the cured product to the polyimide film at 50 hours after PCT was 450 g/25 mm at room temperature, thus the adhesion was maintained.

The cured product obtained also had a modulus of elasticity of 6,000 MPa (a measurement of viscoelasticity measured with Rheolograph Solid S type, manufactured by Toyo Seiki Seisaku-sho Ltd.; 25° C.; tensile mode: 10 Hz), a glass transition temperature of 90° C. and a coefficient of linear expansion of $2.4 \times 10^{-5}/°$ C. (thermomechanical tester: Model TM-700, manufactured by Sinku-Riko, Inc.).

EXAMPLE 6

100 parts by weight of bisphenol A epoxy resin (YD-8125, available from Tohto Kasei Co., Ltd.; epoxy group equivalent weight: 171 g/equivalent weight; specific gravity: 1.16), 3,037 parts by weight of an N,N-dimethylacetamide solution of the elastomer-modified phenoxy resin obtained in Example 1 (phenoxy resin content: 857 parts by weight; elastomer content: 180 parts by weight), 124 parts by weight of a solution prepared by dissolving 62 parts by weight of phenol novolak resin (H-400, available from Meiwa Plastics Industry Ltd.; hydroxyl group equivalent weight: 106 g/equivalent weight) in 62 parts by weight of an N,N-dimethylacetamide solution, 108 parts by weight of the blocked isocyanate/cyclohexanone solution obtained in Synthesis Example 4 (blocked isocyanate content: 41 parts by weight), 3 parts by weight of 2-ethyl-4-methylimidazole tetraphenylborate (EMZ-K, available from Hokko Chemical Industry Co., Ltd.), 2,951 parts by weight of spherical fused silica having an average particle diameter of 8 $\mu$m (specific surface area: 2.0 $m^2/g$), 4.6 parts by weight of γ-ureidopropyltriethoxylsilane (AY43-031, available from Dow Corning Toray Silicone Co., Ltd.), 14.3 parts by weight of isocyanatopropyltriethoxysilane (KBE-9007, available from Shin-Etsu Chemical Co., Ltd.) and 25 parts by weight of an organic black dye (VALIFAST BLACK 3820, available from Orient Chemical Industries, Ltd.) were mixed, and were stirred and blended under reduced pressure for 25 minutes using an automated mortar (manufactured by Ishikawa MFG. Co., Ltd.).

The molding material for encapsulating thus obtained had a viscosity of about 36 P (20 rpm). This was casted over the side A (specified by the manufacturer) of a polyimide film (UPILEX 75S, available from Ube Industries, Ltd.) with a layer thickness of 75 $\mu$m to which a spacer of about 300 $\mu$m thick was attached. A cured product formed after heating at 90° C. for 20 minutes and then at 150° C. for 3 hours was examined on its peel strength to the polyimide film to find that it was 650 g/25 mm at room temperature and 1,100 g/25 mm at 120° C., and had a high adhesion over a broad temperature region.

The cured product obtained was put to a pressure cooker test (PCT). As a result, the peel strength of the cured product to the polyimide film at 50 hours after PCT was 300 g/25 mm at room temperature, thus the adhesion was maintained. The cured product obtained also had a modulus of elasticity of 5,800 MPa (a measurement of viscoelasticity measured with Rheolograph Solid S type, manufactured by Toyo Seiki Seisaku-sho Ltd.; 25° C.; tensile mode: 10 Hz), a glass transition temperature of 102° C. and a coefficient of linear expansion of $2.2 \times 10^{-5}/°$ C. (thermomechanical tester: Model TM-700, manufactured by Sinku-Riko, Inc.).

EXAMPLE 7

(Preparation 3 of phenoxy resin modified with carboxyl-group-containing butadiene elastomer)

The procedure of Example 1 was repeated except for using a solution prepared by dissolving in 565.33 g of an N,N-dimethylacetamide solution 242.29 g of a phenoxy resin obtained by pouring a phenoxy resin solution YPB-40AM40 (a bromide available from Tohto Kasei Co., Ltd.; hydroxyl group equivalent weight: 349 g/equivalent weight) in methanol followed by purification by reprecipitation. Thus, an N,N-dimethylacetamide solution of the desired elastomer-modified phenoxy resin 3 was obtained.

The solution thus obtained was transparent, and had a solution viscosity of about 1,000 cP. A portion of the reaction solution was poured into a large quantity of methanol to cause solid matter to precipitate, followed by washing with methanol and then drying under reduced pressure to obtain an elastomer-modified phenoxy resin for measuring molecular weight.

Weight-average molecular weight of the resultant elastomer-modified phenoxy resin in terms of polystyrene was measured by gel permeation chromatography (conditions: the same as those in Synthesis Example 2) to find that it was 40,000. Incidentally, the weight-average molecular weight of YPB-40AM40 in terms of polystyrene was 30,000.

4,810 parts by weight of the N,N-dimethylacetamide solution of elastomer-modified phenoxy resin 3 thus obtained (phenoxy resin content: 1,357 parts by weight; elastomer content: 285 parts by weight), 200 parts by weight of a solution prepared by dissolving 100 parts by weight of o-cresol novolak epoxy resin (YDCN702S, available from Tohto Kasei Co., Ltd.; epoxy equivalent weight: 201 g/equivalent weight; specific gravity: 1.21) in 100 parts by weight of cyclohexanone, 106 parts by weight of a solution prepared by dissolving 53 parts by weight of phenol novolak resin (H-400, available from Meiwa Plastics Industry Ltd.; hydroxyl group equivalent weight: 106 g/equivalent weight) in 53 parts by weight of an N,N-dimethylacetamide solution, 168 parts by weight of the blocked isocyanate/cyclohexanone solution obtained in Synthesis Example 4 (blocked isocyanate content: 64 parts by weight), 4.8 parts by weight of 2-ethyl-4-methylimidazole tetraphenylborate (EMZ-K, available from Hokko Chemical Industry Co., Ltd.), 4,396 parts by weight of spherical fused silica having an average particle diameter of 8 μm (specific surface area: 2.0 m$^2$/g), 7.2 parts by weight of γ-ureidopropyltriethoxylsilane (AY43-031, available from Dow Corning Toray Silicone Co., Ltd.), 22 parts by weight of isocyanatopropyltriethoxysilane (KBE-9007, available from Shin-Etsu Chemical Co., Ltd.) and 38 parts by weight of an organic black dye (VALIFAST BLACK 3820, available from Orient Chemical Industries, Ltd.) were mixed, and were stirred and blended under reduced pressure for 25 minutes using an automated mortar (manufactured by Ishikawa MFG. Co., Ltd.).

The molding material for encapsulating thus obtained had a viscosity of about 45 P (20 rpm). This was casted over the side A (specified by the manufacturer) of a polyimide film (UPILEX 75S, available from Ube Industries, Ltd.) with a layer thickness of 75 μm to which a spacer of about 300 μm thick was attached. A cured product formed after heating at 90° C. for 20 minutes and then at 150° C. for 3 hours was examined on its peel strength to the polyimide film to find that it was 600 g/25 mm at room temperature and 1,000 g/25 mm at 120° C., and had a high adhesion over a broad temperature region.

The cured product obtained was put to a pressure cooker test (PCT). As a result, the peel strength of the cured product to the polyimide film at 50 hours after PCT was 400 g/25 mm at room temperature, thus the adhesion was maintained. The cured product obtained also had a modulus of elasticity of 5,500 MPa (a measurement of viscoelasticity measured with Rheograph Solid S type, manufactured by Toyo Seiki Seisaku-sho Ltd.; 25° C.; tensile mode: 10 Hz), a glass transition temperature of 105° C. and a coefficient of linear expansion of 2.1×10$^{-5}$/° C. (thermomechanical tester: Model TM-700, manufactured by Sinku-Riko, Inc.).

EXAMPLE 8

200 parts by weight of a solution prepared by dissolving 100 parts by weight of bisphenol A epoxy resin (EPIKOTE 1001, available from Yuka Shell Epoxy K.K.; epoxy group equivalent weight: 479 g/equivalent weight; specific gravity: 1.2) in 100 parts by weight of cyclohexanone, 3,037 parts by weight of an N,N-dimethylacetamide solution of the elastomer-modified phenoxy resin of Example 1 (phenoxy resin content: 857 parts by weight; elastomer content: 180 parts by weight), 44 parts by weight of a solution prepared by dissolving 22 parts by weight of phenol novolak resin (H-400, available from Meiwa Plastics Industry Ltd.; hydroxyl group equivalent weight: 106 g/equivalent weight) in 22 parts by weight of an N,N-dimethylacetamide solution, 108 parts by weight of the blocked isocyanate/cyclohexanone solution obtained in Synthesis Example 4 (blocked isocyanate content: 41 parts by weight), 3 parts by weight of 2-ethyl-4-methylimidazole tetraphenylborate (EMZ-K, available from Hokko Chemical Industry Co., Ltd.), 2,857 parts by weight of spherical fused silica having an average particle diameter of 8 μm (specific surface area: 2.0 m$^2$/g), 5 parts by weight of γ-ureidopropyltriethoxylsilane (AY43-031, available from Dow Corning Toray Silicone Co., Ltd.), 14 parts by weight of isocyanatopropyltriethoxysilane (KBE-9007, available from Shin-Etsu Chemical Co., Ltd.) and 24 parts by weight of an organic black dye (VALIFAST BLACK 3820, available from Orient Chemical Industries, Ltd.) were mixed, and were stirred and blended under reduced pressure for 25 minutes using an automated mortar (manufactured by Ishikawa MFG. Co., Ltd.).

The molding material for encapsulating thus obtained had a viscosity of about 30 P (20 rpm). This was casted over the side A (specified by the manufacturer) of a polyimide film (UPILEX 75S, available from Ube Industries, Ltd.) with a layer thickness of 75 μm to which a spacer of about 300 μm thick was attached. A cured product formed after heating at 90° C. for 20 minutes and then at 150° C. for 3 hours was examined on its peel strength to the polyimide film to find that it was 700 g/25 mm at room temperature and 1,200 g/25 mm at 120° C., and had a high adhesion over a broad temperature region.

The cured product obtained was put to a pressure cooker test (PCT). As a result, the peel strength of the cured product to the polyimide film at 50 hours after PCT was 300 g/25 mm at room temperature, thus the adhesion was maintained. The cured product obtained also had a modulus of elasticity of 5,800 MPa (a measurement of viscoelasticity measured with Rheograph Solid S type, manufactured by Toyo Seiki Seisaku-sho Ltd.; 25° C.; tensile mode: 10 Hz), a glass transition temperature of 100° C. and a coefficient of linear expansion of 2.2×10$^{-5}$/° C. (thermomechanical tester: Model TM-700, manufactured by Sinku-Riko, Inc.).

EXAMPLE 9

200 parts by weight of a solution prepared by dissolving 100 parts by weight of o-cresol novolak epoxy resin (YDCN702S, available from Tohto Kasei Co., Ltd.; epoxy equivalent weight: 201 g/equivalent weight; specific gravity: 1.21) in 100 parts by weight of γ-butyrolactone, 4,783 parts by weight of a solution (phenoxy resin content: 1,348 parts by weight; elastomer content: 283 parts by weight) prepared by dissolving in 328 g of γ-butyrolactone 170 g of the elastomer-modified phenoxy resin obtained in Example 1, 106 parts by weight of a solution prepared by dissolving 53 parts by weight of phenol novolak resin (H-400, available from Meiwa Plastics Industry Ltd.; hydroxyl group equivalent weight: 106 g/equivalent weight) in 53 parts by weight of γ-butyrolactone, 85 parts by weight of the blocked isocyanate/cyclohexanone solution obtained in Synthesis Example 4 (blocked isocyanate content: 32 parts by weight), 4.8 parts by weight of 2-ethyl-4-methylimidazole tetraphenylborate (EMZ-K, available from Hokko Chemical Industry Co., Ltd.), 4,321 parts by weight of amorphous spherical silica having an average particle diameter of 4 μm (specific surface area: 0.8 m$^2$/g), 3.4 parts by weight of γ-ureidopropyltriethoxylsilane (AY43-031, available from Dow Corning Toray Silicone Co., Ltd.), 10.4 parts by weight of isocyanatopropyltriethoxysilane (KBE-9007, available from Shin-Etsu Chemical Co., Ltd.) and 37 parts by weight of an organic black dye (VALIFAST BLACK 3820, available from Orient Chemical Industries, Ltd.) were mixed, and were stirred and blended under reduced pressure for 30 minutes using an automated mortar (manufactured by Ishikawa MFG. Co., Ltd.).

The molding material for encapsulating thus obtained had a viscosity of about 44 P (20 rpm). This was casted over the side A (specified by the manufacturer) of a polyimide film (UPILEX 75S, available from Ube Industries, Ltd.) with a layer thickness of 75 μm to which a spacer of about 300 μm thick was attached. This was heated at 120° C. for 5 minutes. As a result, the film surface became tack-free and also no voids were seen. A cured product formed after subsequently heating at 150° C. for 2 hours was examined on its peel strength to the polyimide film to find that it was 600 g/25 mm at room temperature and 1,000 g/25 mm at 120° C., and had a high adhesion over a broad temperature region.

The cured product obtained was put to a pressure cooker test (PCT). As a result, the peel strength of the cured product to the polyimide film at 50 hours after PCT was 400 g/25 mm at room temperature, thus the adhesion was maintained. The cured product obtained also had a modulus of elasticity of 5,500 MPa (a measurement of viscoelasticity measured with Rheolograph Solid S type, manufactured by Toyo Seiki Seisaku-sho Ltd.; 25° C.; tensile mode: 10 Hz), a glass transition temperature of 105° C. and a coefficient of linear expansion of $2.1 \times 10^{-5}$/° C. (thermomechanical tester: Model TM-700, manufactured by Sinku-Riko, Inc.).

Comparative Example 5

(Epoxy resin/unmodified phenoxy resin system)

100 parts by weight of bisphenol A epoxy resin (YD-8125, available from Tohto Kasei Co., Ltd.; epoxy group equivalent weight: 172 g equivalent weight), 2,857 parts by weight of an N,N-dimethylacetamide solution of the phenoxy resin obtained in Synthesis Example 1 (phenoxy resin content: 857 parts by weight), 122 parts by weight of a solution prepared by dissolving 61 parts by weight of phenol novolak resin (H-400, available from Meiwa Plastics Industry Ltd.; hydroxyl group equivalent weight: 106 g/equivalent weight) in 61 parts by weight of an N,N-dimethylacetamide solution, 109 parts by weight of the blocked isocyanate/cyclohexanone solution obtained in Synthesis Example 4 (blocked isocyanate content: 41 parts by weight), 3 parts by weight of 2-ethyl-4-methylimidazole tetraphenylborate (EMZ-K, available from Hokko Chemical Industry Co., Ltd.), 2,522 parts by weight of spherical fused silica having an average particle diameter of 8 μm (specific surface area: 2.0 m²/g), 4 parts by weight of γ-ureidopropyltriethoxylsilane (AY43-031, available from Dow Corning Toray Silicone Co., Ltd.), 12 parts by weight of isocyanatopropyltriethoxysilane (KBE-9007, available from Shin-Etsu Chemical Co., Ltd.) and 21 parts by weight of an organic black dye (VALIFAST BLACK 3820, available from Orient Chemical Industries, Ltd.) were mixed, and were stirred and blended under reduced pressure for 25 minutes using an automated mortar (manufactured by Ishikawa MFG. Co., Ltd.).

The molding material for encapsulating thus obtained had a viscosity of about 35 P (20 rpm). This was casted over the side A (specified by the manufacturer) of a polyimide film (UPILEX 75S, available from Ube Industries, Ltd.) with a layer thickness of 75 μm to which a spacer of about 300 μm thick was attached. A cured product formed after heating at 90° C. for 20 minutes and then at 150° C. for 3 hours was examined on its peel strength to the polyimide film to find that it was 200 g/25 mm at room temperature and 300 g/25 mm at 120° C., thus the product did not have a sufficient adhesion. The cured product obtained also had a modulus of elasticity of 8,000 MPa (a measurement of viscoelasticity measured with Rheolograph Solid S type, manufactured by Toyo Seiki Seisaku-sho Ltd.; 25° C.; tensile mode: 10 Hz). Thus, the system making use of the elastomer-unmodified phenoxy resin was not able to achieve a low elasticity.

Comparative Example 6

(Epoxy resin/elastomer-modified epoxy resin system)

(Preparation of epoxy resin modified with carboxyl-group-containing butadiene elastomer)

Into a 500-ml four-necked flask provided with a nitrogen feed pipe, a thermometer, a condenser and a mechanical stirrer, 244.16 g of bisphenol A epoxy resin (YD-8125, available from Tohto Kasei Co., Ltd.; epoxy group equivalent weight: 172 g/equivalent weight) and 61.04 g of a terminal carboxyl-group-containing butadiene-acrylonitrile copolymer (Hycar CTBNX1009-SP, available from Ube Industries, Ltd.) were introduced, and were stirred and mixed in an atmosphere of nitrogen. The reaction was carried out at 180° C. for 1.5 hours while raising the temperature thereto gradually. The elastomer-modified phenoxy resin thus obtained had an epoxy equivalent weight of 223 g/equivalent weight.

1,111 parts by weight of a solution prepared by dissolving 379 parts by weight of the resultant elastomer-modified phenoxy resin in 732 parts by weight of an N,N-dimethylacetamide solution, 100 parts by weight of bisphenol A epoxy resin (YD-8125, available from Tohto Kasei Co., Ltd.; epoxy group equivalent weight: 172 g/equivalent weight), 484 parts by weight of a solution prepared by dissolving 242 parts by weight of phenol novolak resin (H-400, available from Meiwa Plastics Industry Ltd.: hydroxyl group equivalent weight: 106 g/equivalent weight) in 242 parts by weight of an N,N-dimethylacetamide solution, 12 parts by weight of 2-ethyl-4-methylimidazole tetraphenylborate (EMZ-K, available from Hokko Chemical Industry Co., Ltd.). 1.717 parts by weight of spherical fused silica having an average particle diameter of 8 μm (specific surface area: 2.0 m²/g). 12 parts by weight of γ-ureidopropyltriethoxylsilane (AY43-031 available from Dow Corning Toray Silicone Co., Ltd.) and 14 parts by weight of an organic black dye (VALIFAST BLACK 3820, available from Orient Chemical Industries, Ltd.) were mixed, and were stirred and blended under reduced pressure for 25 minutes using an automated mortar (manufactured by Ishikawa MFG. Co., Ltd.).

The molding material for encapsulating thus obtained had a viscosity of about 10 P (20 rpm). This was casted over the side A (specified by the manufacturer) of a polyimide film (UPILEX 75S. available from Ube Industries, Ltd.) with a layer thickness of 75 μm to which a spacer of about 300 μm thick was attached. A cured product formed after heating at 90° C. for 30 minutes and then at 150° C. for 3 hours was examined on its peel strength to the polyimide film to find that it was 150 g/25 mm at room temperature and 300 g/25 mm at 120° C., thus the product did not have a sufficient adhesion.

Comparative Example 7

(No epoxy resin added/elastomer-modified phenoxy resin system)

3,037 parts by weight of an N,N-dimethylacetamide solution of the elastomer-modified phenoxy resin of Example 1 (phenoxy resin content: 100 parts by weight; elastomer content: 21 parts by weight), 13 parts by weight of the blocked isocyanate/cyclohexanone solution obtained in Synthesis Example 4 (blocked isocyanate content: 5 parts by weight), 300 parts by weight of spherical fused silica having an average particle diameter of 8 μm (specific surface area: 2.0 m$^2$/g), 2 parts by weight of isocyanatopropyltriethoxysilane (KBE-9007, available from Shin-Etsu Chemical Co., Ltd.) and 3 parts by weight of an organic black dye (VALIFAST BLACK 3820, available from Orient Chemical Industries, Ltd.) were mixed, and were stirred and blended under reduced pressure for 25 minutes using an automated mortar (manufactured by Ishikawa MFG. Co., Ltd.).

The molding material for encapsulating thus obtained had a viscosity of about 20 P (20 rpm). This was casted over the side A (specified by the manufacturer) of a polyimide film (UPILEX 75S, available from Ube Industries, Ltd.) with a layer thickness of 75 μm to which a spacer of about 300 μm thick was attached. A cured product formed after heating at 90° C. for 20 minutes and then at 150° C. for 3 hours was examined on its peel strength to the polyimide film to find that it was 150 g/25 mm at room temperature and 150 g/25 mm at 120° C., thus the product did not have a sufficient adhesion.

Comparative Example 8

(Simply elastomer-blended system)

100 parts by weight of bisphenol A epoxy resin (YD-8125, available from Tohto Kasei Co., Ltd.; epoxy group equivalent weight: 172 g/equivalent weight), 2857 parts by weight of the phenoxy resin/N,N-dimethylacetamide solution obtained in Synthesis Example 1 (phenoxy resin content: 857 parts by weight), 180 parts by weight of a terminal carboxyl-group-containing butadiene-acrylonitrile copolymer (Hycar CTBNX1009-SP, available from Ube Industries, Ltd.), 122 parts by weight of a solution prepared by dissolving 61 parts by weight of phenol novolak resin (H-400, available from Meiwa Plastics Industry Ltd.; hydroxyl group equivalent weight: 106 g/equivalent weight) in 61 parts by weight of an N,N-dimethylacetamide solution, 109 parts by weight of the blocked isocyanate/cyclohexanone solution (blocked isocyanate content: 41 parts by weight), 3 parts by weight of 2-ethyl-4-methylimidazole tetraphenylborate (EMZ-K, available from Hokko Chemical Industry Co., Ltd.), 2,954 parts by weight of spherical fused silica having an average particle diameter of 8 μm (specific surface area: 2.0 m$^2$/g), 5 parts by weight of γ-ureidopropyltriethoxylsilane (AY43-031, available from Dow Corning Toray Silicone Co., Ltd.), 14 parts by weight of isocyanatopropyltriethoxysilane (KBE-9007, available from Shin-Etsu Chemical Co., Ltd.) and 26 parts by weight of an organic black dye (VALIFAST BLACK 3820, available from Orient Chemical Industries, Ltd.) were mixed, and were stirred and blended under reduced pressure for 25 minutes using an automated mortar (manufactured by Ishikawa MFG. Co., Ltd.).

The molding material for encapsulating thus obtained had a viscosity of about 50 P (20 rpm). This was casted over the side A (specified by the manufacturer) of a polyimide film (UPILEX 75S, available from Ube Industries, Ltd.) with a layer thickness of 75 μm to which a spacer of about 300 μm thick was attached. A cured product formed after heating at 90° C. for 20 minutes and then at 150° C. for 3 hours was examined on its peel strength to the polyimide film to find that it was 350 g/25 mm at room temperature and 400 g/25 mm at 120° C. However, the peel strength of the cured product to the polyimide film at 24 hours after the pressure cooker test (PCT) was 25 g/25 mm at room temperature, thus the cured product little retained the adhesion.

Comparative Example 9

(Elastomer-modified epoxy resin/unmodified phenoxy resin system)

100 parts by weight of the elastomer-modified phenoxy resin obtained in Comparative Example 6, 317 parts by weight of the phenoxy resin/N,N-dimethylacetamide solution obtained in Synthesis Example 1 (phenoxy resin content: 95 parts by weight), 96 parts by weight of a solution prepared by dissolving 48 parts by weight of phenol novolak resin (H-400, available from Meiwa Plastics Industry Ltd.; hydroxyl group equivalent weight: 106 g/equivalent weight) in 48 parts by weight of an N,N-dimethylacetamide solution, 12 parts by weight of the blocked isocyanate/cyclohexanone solution obtained in Synthesis Example 4 (blocked isocyanate content: 5 parts by weight), 48 parts by weight of N,N-dimethylacetamide, 2 parts by weight of 2-ethyl-4-methylimidazole tetraphenylborate (EMZ-K, available from Hokko Chemical Industry Co., Ltd.), 589 parts by weight of spherical fused silica having an average particle diameter of 8 μm (specific surface area: 2.0 m$^2$/g), 3 parts by weight of γ-ureidopropyltriethoxylsilane (AY43-031, available from Dow Corning Toray Silicone Co., Ltd.), 1 part by weight of isocyanatopropyltriethoxysilane (KBE-9007, available from Shin-Etsu Chemical Co., Ltd.) and 5 parts by weight of an organic black dye (VALIFAST BLACK 3820, available from Orient Chemical Industries, Ltd.) were mixed, and were stirred and blended under reduced pressure for 25 minutes using an automated mortar (manufactured by Ishikawa MFG. Co., Ltd.).

The molding material for encapsulating thus obtained had a viscosity of about 25 P (20 rpm). This was casted over the side A (specified by the manufacturer) of a polyimide film (UPILEX 75S, available from Ube Industries, Ltd.) with a layer thickness of 75 μm to which a spacer of about 300 μm thick was attached. A cured product formed after heating at 90° C. for 20 minutes and then at 150° C. for 3 hours was examined on its peel strength to the polyimide film to find that it was 150 g/25 mm at room temperature and 150 g/25 mm at 120° C., thus the product did not have a sufficient adhesion.

The results of moisture resistance tests made using ICs for evaluation are shown here in order to clarify the effect of the present invention. The IC used for the evaluation of moisture resistance comprises a tape carrier on which a device of about 2×10 mm has been mounted. The molding materials obtained in Examples and Comparative Example were each coated as shown in FIG. 1 and then cured at 150° C. for 3 hours. Reliability of moisture resistance was also examined by whether or not any disconnection due to the corrosion of aluminum wiring on the device occurred after it was left in an atmosphere of 121° C. and 2 atmospheric pressures. The results of evaluation are shown in Tables 2 and 3 together. These tables also show the content of resin components, and the boiling points of solvents for the base resin used in Examples, and the average particle diameter of inorganic fillers used in Examples and Comparative Examples.

Similar results were obtained also when the heat curing was carried out at 150° C. for 2 hours.

TABLE 2

| Items | Example 5 | 6 | 7 | 8 | 9 |
|---|---|---|---|---|---|
| Content (vol. %): | | | | | |
| Epoxy resin: | 21 | 11 | 7 | 10 | 7 |
| Elastomer: | 21 | 24 | 25 | 24 | 25 |
| Phenoxy resin: | 58 | 65 | 68 | 66 | 68 |
| Boiling point of base-resin solvent: (° C.) | 165 | 165 | 165 | 165 | 204 |
| Average particle diameter of filler: (μm) | 8 | 8 | 8 | 8 | 4 |
| Peel strength (g/25 mm): | | | | | |
| Room temp.: | 800 | 650 | 600 | 700 | 600 |
| 120° C.: | 1600 | 1100 | 1000 | 1200 | 1000 |
| Appearance: | A | A | A | A | A |
| Surface smoothness: | A | A | A | A | A |
| Precure performance: | A | A | A | A | A |
| Bending: | A | A | A | A | A |
| Moisture resistance: (hrs) | 400 | 500 | 550 | 500 | 550 |

A Excellent

TABLE 3

| Items | Comparative Example 5 | 6 | 7 | 8 | 9 |
|---|---|---|---|---|---|
| Average particle diameter of filler: (μm) | 8 | 8 | 8 | 8 | 8 |
| Peel strength (g/25 mm): | | | | | |
| Room temp.: | 200 | 150 | 150 | 350 | 150 |
| 120° C.: | 300 | 300 | 150 | 400 | 150 |
| Appearance: | B | D | A | B | B |
| Surface smoothness: | A | D | A | A | A |
| Precure performance: | A | D | A | A | A |
| Bending: | D | D | A | A | D |
| Moisture resistance: (hrs) | 150 | 150 | 100 | <100 | 150 |

A Excellent B Good D Poor

In Tables 2 and 3, the surface smoothness is examined by visual observation and hand feeling of how the films stand after heat curing, and the results of evaluation are indicated as "A" (Excellent; a good-quality film having a good surface smoothness) or "D" (Poor; a film having many fine irregularities on the surface). The precure performance is examined by observing precure time and how the films stand after precuring, and the results of evaluation are indicated as "A" (Excellent; a good-quality film formed within a precure time of 10 minutes and also free of voids) or "D" (Poor; a film formed in a precure time of 30 minutes or more and also have many voids). Here, the presence or absence of voids is examined by visual observation or soft X-ray observation. The bending is examined by observing how the cured product stands when it is bent by nearly 180 degrees, and the results of evaluation are indicated as "A" (Excellent; no break) or "D" (Poor; cracked or broken). The moisture resistance is evaluated by hours for which no disconnection has occurred.

Examples of the present invention show superior adhesion, toughness and moisture resistance and also a good surface smoothness. Tack-free conditions can also be fulfilled without step curing.

Electron-microscopic Observation

Films formed out of N,N-dimethylacetamide solutions of the phenoxy resins modified with carboxyl-group-containing elastomers (Examples 1 to 4) or mixtures comprising mere blends of carboxyl-group-containing elastomers with phenoxy resins (Comparative Examples 2 to 4) and a cured film formed out of the epoxy resin modified with a carboxyl-group-containing butadiene elastomer (prepared in Comparative Example 6) were each cooled in liquid nitrogen and thereafter bend-ruptured. Their rupture cross-sections were observed using a scanning electron microscope (S-800, manufactured by Hitachi Ltd.)

The elastomer-modified phenoxy resins of Examples 1 to 4 were all found to form the phase-separated structure and to have a fine structure wherein microdomains of about 0.1 to 0.3 μm were connected. In contrast, the mere blend resins of Comparative Examples 2 to 4 also formed a phase-separated structure wherein elastomer particles were dispersed in the phenoxy resin, but their domain size was as large as about 2 to 5 μm. Meanwhile, the elastomer-modified epoxy resin was also seen to have a structure wherein about 1 to 2 μm macroscopic spherical domains of elastomers as conventionally known were dispersed in the epoxy resin, and was seen not to have any fine structure which was seen in the phenoxy resin modified with a carboxyl-group-containing butadiene-acrylonitrile copolymer.

Measurement of Dynamic Viscosity

30% by weight γ-butyrolactone solutions of the elastomer-modified phenoxy resins of Examples 1 to 4 and a 30% by weight γ-butyrolactone solution of the phenoxy resin (a bromide) of Comparative Example 1 were each casted over a release-treated glass plate to which a spacer of about 300 μm thick was attached. These were heated at 70° C. for 20 minutes, at 90° C. for 20 minutes and then at 120° C. for 2 hours to evaporate the solvent to obtain film forms of 75 μm in layer thickness. Using a dynamic viscoelastic spectrometer (Viscosity Analyzer RSA-II, manufactured by Rheometric Scientific F.E. Ltd.), the dynamic viscosity of each film was measured under conditions of a frequency of 1 Hz and a rate of temperature rise of 5° C./min.

In the film of the phenoxy resin of Comparative Example 1, a tan δ peak of main dispersion of phenoxy resin phases was observed at 110° C. As for the films of the elastomer-modified phenoxy resins of Examples 1 to 4, a tan δ peak of main dispersion of elastomer phases and a tan δ peak of main dispersion of phenoxy resin phases were independently observed at –40° C. and at 108° C., respectively, in the cases of Examples 1, 3 and 4; and a tan δ peak of elastomer phases and a tan δ peak of phenoxy resin phases, at –42° C. and at 109° C., respectively, in the case of Example 2. This enabled to confirm that the phenoxy resin and the carboxyl-group-containing elastomer stood phase-separated in all the elastomer-modified phenoxy resins of Examples 1 to 4.

Possibility of Industrial Application

The resin of the present invention has a superior adhesion and is suitable as an adhesive or a coating material. It also can form films with ease, and hence is usable as a film material.

The molding material for encapsulating electronic components according to the present invention has superior adhesion, flexibility, toughness, surface smoothness, precure performance (tack-freeness, film-forming properties) and moisture resistance reliability, and is suitable as a molding material for encapsulating electronic components as typified by a liquid encapsulating material for TCPs.

What is claimed is:

1. A phase-separated structure obtained from the modification a phenoxy resin with a carboxyl-group-containing elastomer, said phenoxy resin and said carboxyl-group-containing elastomer standing phase-separated, and said phase-separated structure having a light transmittance of 10% or more of the light transmittance of air at a wavelength of 500 nm, as a film form of 75 μm in layer thickness.

2. The phase-separated structure according to claim 1, wherein said phenoxy resin contains one or more component units represented by the following general formula (I) and/or (II):

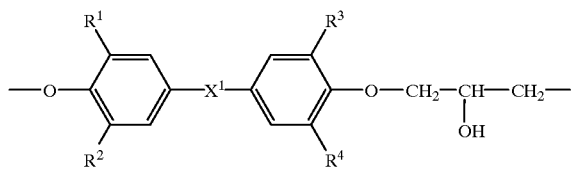

(I)

wherein $X^1$ represents a divalent organic group or a bond, and $R^1$, $R^2$, $R^3$ and $R^4$ are each independently selected from a hydrogen atom, an alkyl group having 1 to 4 carbon atoms and an electron-withdrawing group wherein at least one of $R^1$, $R^2$, $R^3$ and $R^4$ is an electron-withdrawing group;

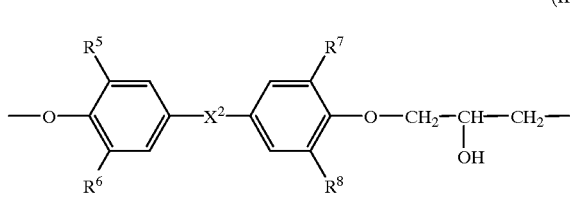

(II)

wherein $X^2$ represents a divalent organic group or a bond, and $R^5$, $R^6$, $R^7$ and $R^8$ are each independently selected from a hydrogen atom and an alkyl group having 1 to 4 carbon atoms.

3. A resin composition comprising;
the phase-separated structure according to claim 1;
an epoxy resin; and
a curing agent for the epoxy resin.

4. A resin composition comprising;
the phase-separated structure according to claim 2;
an epoxy resin; and
a curing agent for the epoxy resin.

5. A molding material for encapsulating electronic components which comprises the resin composition according to claim 3.

6. A molding material for encapsulating electronic components which comprises the resin composition according to claim 4.

7. A molding material for encapsulating electronic components which comprises;
(A) an epoxy resin;
(B) a phenoxy resin modified with a carboxyl-group-containing elastomer;
(C) a curing agent for the epoxy resin;
(D) a curing agent for the phenoxy resin;
(E) an inorganic filler; and
(F) an organic solvent.

8. The molding material for encapsulating electronic components according to claim 7, wherein said carboxyl-group-containing elastomer is a carboxyl-group-containing butadiene elastomer.

9. The molding material for encapsulating electronic components according to claim 7, wherein, based on 100 parts by volume of the total of said epoxy resin and said phenoxy resin modified with a carboxyl-group-containing elastomer;

said epoxy resin is in a content of from 2 to 25 parts by volume; and said phenoxy resin modified with a carboxyl-group-containing elastomer is obtained using from 50 to 85 parts by volume of a phenoxy resin and from 10 to 35 parts by volume of a carboxyl-group-containing elastomer.

10. An electronic component device having an electronic component encapsulated with the molding material for encapsulating electronic components according to claim 5.

11. An electronic component device having an electronic component encapsulated with the molding material for encapsulating electronic components according to claim 6.

12. An electronic component device having an electronic component encapsulated with the molding material for encapsulating electronic components according to claim 7.

13. An electronic component device having an electronic component encapsulated with the molding material for encapsulating electronic components according to claim 8.

14. An electronic component device having an electronic component encapsulated with the molding material for encapsulating electronic components according to claim 9.

15. The phase-separated structure according to claim 2, wherein said phenoxy resin is at least one of the following (1) to (4):

(1) A random copolymer consisting essentially of a repeating unit represented by the following structural formula (III) and a repeating unit represented by the following structural formula (IV):

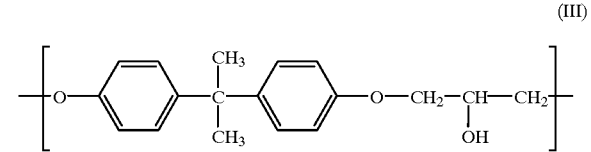

(III)

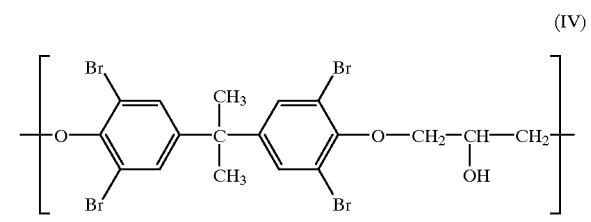

(IV)

(2) A polymer consisting essentially of a repeating unit represented by the following structural formula (V):

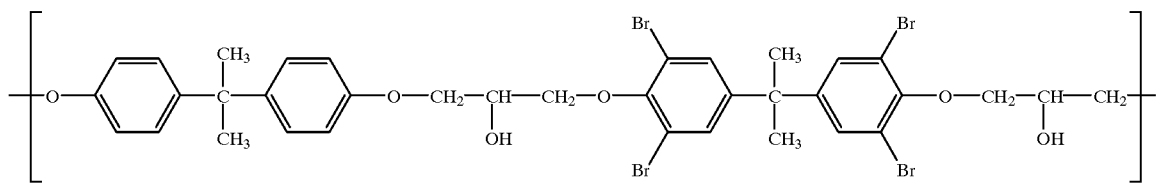

(V)

(3) A polymer consisting essentially of a repeating unit represented by the following structural formula (VI):

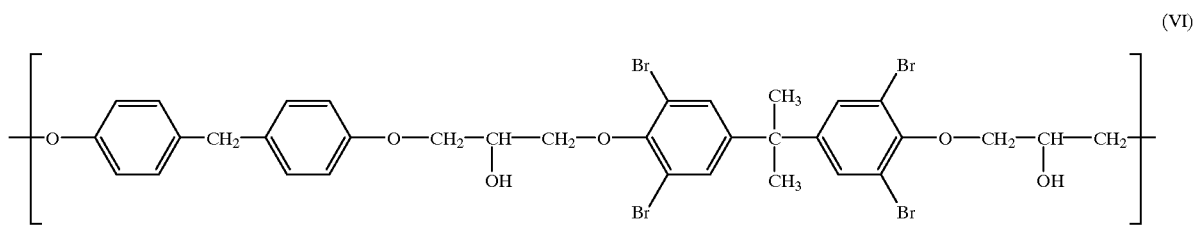

(VI)

(4) A polymer consisting essentially of a repeating unit represented by the following structural formula (VII):

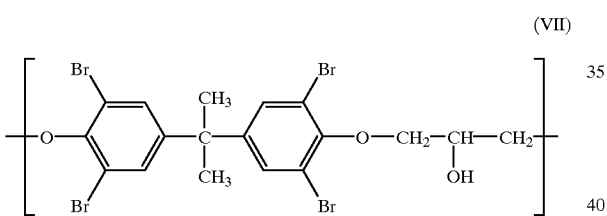

(VII)

16. The phase-separated structure according to claim 1, wherein said carboxyl-group-containing elastomer is at least one of polybutadiene, a butadiene-styrene copolymer and a butadiene-acrylonitrile copolymer.

17. The phase-separated structure according to claim 2, wherein said carboxyl-group-containing elastomer is at least one of polybutadiene, a butadiene-styrene copolymer and a butadiene-acrylonitrile copolymer.

18. The phase-separated structure according to claim 15, wherein said carboxyl-group-containing elastomer is at least one of polybutadiene, a butadiene-styrene copolymer and a butadiene-acrylonitrile copolymer.

19. The phase-separated structure according to claim 16, wherein said carboxyl-group-containing elastomer is a butadiene-acrylonitrile copolymer.

20. The phase-separated structure according to claim 17, wherein said carboxyl-group-containing elastomer is a butadiene-acrylonitrile copolymer.

21. The phase-separated structure according to claim 18, wherein said carboxyl-group-containing elastomer is a butadiene-acrylonitrile copolymer.

22. A phenoxy resin modified with a carboxyl-group-containing elastomer obtained from a phenoxy resin and a carboxyl-group-containing elastomer, wherein;

said phenoxy resin modified with a carboxyl-group-containing elastomer has a light transmittance of 10% or more of the light transmittance of air at a wavelength of 500 nm, as a film form of 75 μm in layer thickness;

said phenoxy resin is at least one of the following (1) to (4):

(1) A random copolymer consisting essentially of a repeating unit represented by the following structural formula (III) and a repeating unit represented by the following structural formula (IV):

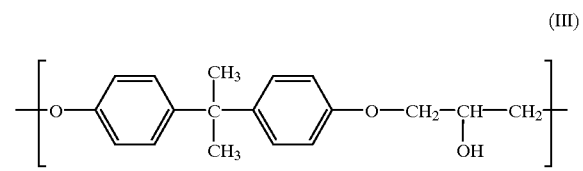

(III)

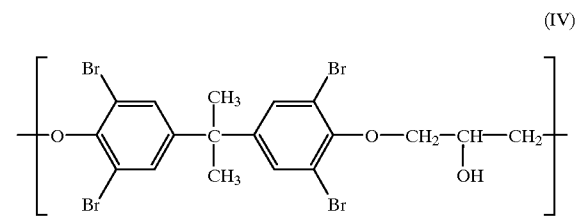

(IV)

(2) A polymer consisting essentially of a repeating unit represented by the following structural formula (V):

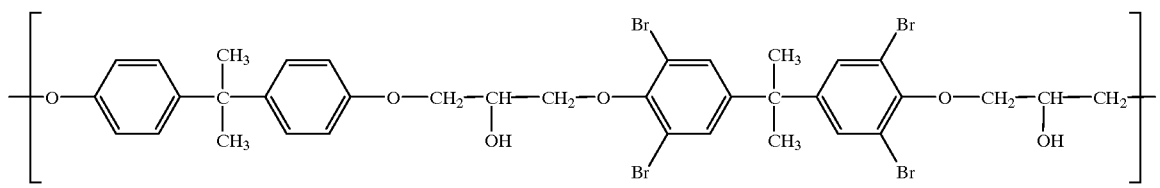

(3) A polymer consisting essentially of a repeating unit represented by the following structural formula (VI):

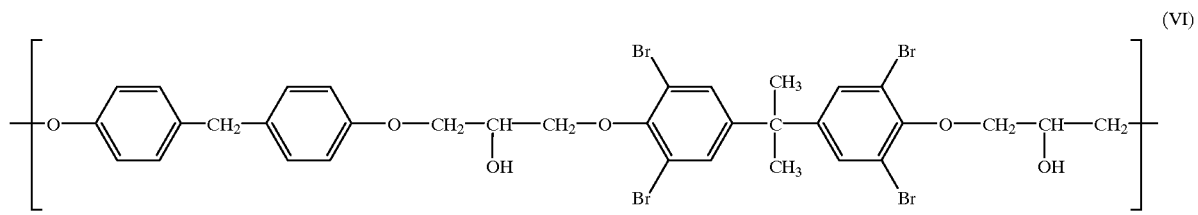

(4) A polymer consisting essentially of a repeating unit represented by the following structural formula (VII):

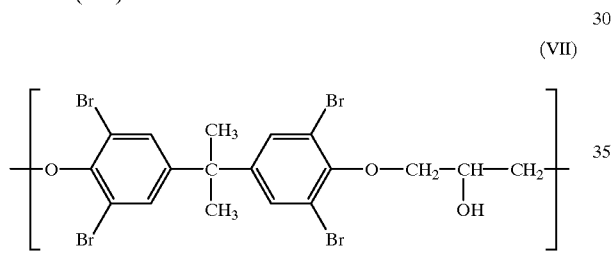

and said carboxyl-group-containing elastomer is at least one of polybutadiene, a butadiene-styrene copolymer and a butadiene-acrylonitrile copolymer.

23. A process for producing a phenoxy resin modified with a carboxyl-group-containing elastomer, comprising the step of heating and mixing a phenoxy resin and a carboxyl-group-containing elastomer, wherein;

the resultant phenoxy resin modified with a carboxyl-group-containing elastomer has a light transmittance of 10% or more of the light transmittance of air at a wavelength of 500 nm, as a film form of 75 μm in layer thickness.

24. A process for producing a phenoxy resin modified with a carboxyl-group-containing elastomer, comprising the step of heating and mixing a phenoxy resin and a carboxyl-group-containing elastomer, wherein the resultant phenoxy resin modified with a carboxyl-group-containing elastomer has a light transmittance of 10% or more of the light transmittance of air at a wavelength of 500 nm, as a film form of 75 μm in layer thickness, and wherein said phenoxy resin contains one or more component units represented by the following general formula (I) and/or (II):

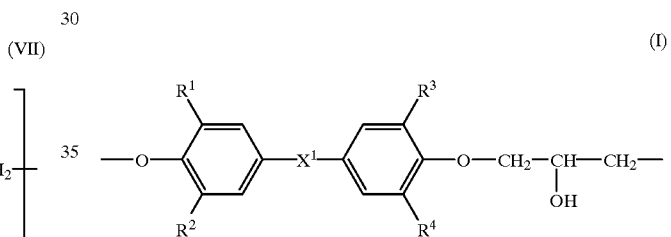

wherein X1 represents a divalent organic group or a bond, and $R^1$, $R^2$, $R^3$ and $R^4$ are each independently selected from a hydrogen atom, an alkyl group having 1 to 4 carbon atoms and an electron-withdrawing group wherein at least one of $R^1$, $R^2$, $R^3$ and $R^4$ is an electron-withdrawing group;

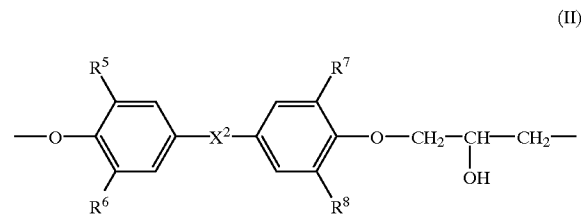

wherein $X^2$ represents a divalent organic group or a bond; and $R^5$, $R^6$, $R^7$ and $R^8$ are each independently selected from a hydrogen atom and an alkyl group having 1 to 4 carbon atoms, and wherein said carboxyl-group-containing elastomer is a butadiene-acrylonitrile copolymer.

* * * * *